(12) United States Patent
Usami et al.

(10) Patent No.: US 9,559,052 B2
(45) Date of Patent: *Jan. 31, 2017

(54) SEMICONDUCTOR DEVICE AND MANUFACTURING METHOD OF THE SAME

(71) Applicant: Renesas Electronics Corporation, Koutou-ku, Tokyo (JP)

(72) Inventors: Tatsuya Usami, Kanagawa (JP); Yukio Miura, Kanagawa (JP); Hideaki Tsuchiya, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/047,623

(22) Filed: Feb. 18, 2016

(65) Prior Publication Data

US 2016/0172298 A1    Jun. 16, 2016

Related U.S. Application Data

(62) Division of application No. 14/381,572, filed as application No. PCT/JP2013/080195 on Nov. 8, 2013, now Pat. No. 9,281,276.

(51) Int. Cl.
*H01L 21/00* (2006.01)
*H01L 23/522* (2006.01)
(Continued)

(52) U.S. Cl.
CPC ..... *H01L 23/5226* (2013.01); *H01L 21/02074* (2013.01); *H01L 21/02126* (2013.01);
(Continued)

(58) Field of Classification Search
CPC .............. H01L 21/76883; H01L 21/76843; H01L 21/768; H01L 21/02126; H01L 21/02271; H01L 21/321; H01L 23/5226; H01L 23/528; H01L 23/53238; H01L 21/263; H01L 21/265; H01L 21/76802; H01L 21/76859
See application file for complete search history.

(56) References Cited

U.S. PATENT DOCUMENTS 9,281,276 B2 * 3/2016 Usami ............... H01L 23/53238
2003/0170993 A1   9/2003 Nagahara et al.
(Continued)

FOREIGN PATENT DOCUMENTS

JP    2003-229481 A    8/2003
JP    2005-302811 A    10/2005
(Continued)

OTHER PUBLICATIONS

Ito, F., et al., "Effective Cu Surface Pre-treatment for High-reliable 22nm-node Cu Dual Damascene Interconnects with High Plasma resistant Ultra Low-k Dielectric (k=2.2)", Advanced Metalization Conference, Oct. 5-7, 2010.

*Primary Examiner* — Richard Booth
(74) *Attorney, Agent, or Firm* — Shapiro, Gabor and Rosenberger, PLLC

(57) ABSTRACT

A semiconductor device includes an interlayer insulating film INS2, adjacent Cu wirings M1W formed in the interlayer insulating film INS2, and an insulating barrier film BR1 which is in contact with a surface of the interlayer insulating film INS2 and surfaces of the Cu wirings M1W and covers the interlayer insulating film INS2 and the Cu wirings M1W. Between the adjacent Cu wirings M1W, the interlayer insulating film INS2 has a damage layer DM1 on its surface, and has an electric field relaxation layer ER1 having a higher nitrogen concentration than a nitrogen concentration of the damage layer DM1 at a position deeper than the damage layer DM1.

18 Claims, 20 Drawing Sheets

(51) Int. Cl.
| | |
|---|---|
| *H01L 21/321* | (2006.01) |
| *H01L 21/768* | (2006.01) |
| *H01L 21/02* | (2006.01) |
| *H01L 21/263* | (2006.01) |
| *H01L 21/265* | (2006.01) |
| *H01L 23/528* | (2006.01) |
| *H01L 23/532* | (2006.01) |
| *H01L 21/3105* | (2006.01) |
| *H01L 21/311* | (2006.01) |

(52) U.S. Cl.
CPC .. *H01L 21/02211* (2013.01); *H01L 21/02271* (2013.01); *H01L 21/02274* (2013.01); *H01L 21/263* (2013.01); *H01L 21/265* (2013.01); *H01L 21/3105* (2013.01); *H01L 21/31144* (2013.01); *H01L 21/321* (2013.01); *H01L 21/768* (2013.01); *H01L 21/76802* (2013.01); *H01L 21/76807* (2013.01); *H01L 21/76808* (2013.01); *H01L 21/76826* (2013.01); *H01L 21/76829* (2013.01); *H01L 21/76831* (2013.01); *H01L 21/76832* (2013.01); *H01L 21/76834* (2013.01); *H01L 21/76843* (2013.01); *H01L 21/76859* (2013.01); *H01L 21/76879* (2013.01); *H01L 21/76883* (2013.01); *H01L 23/528* (2013.01); *H01L 23/5329* (2013.01); *H01L 23/53238* (2013.01); *H01L 23/53295* (2013.01); *H01L 2924/0002* (2013.01)

(56) References Cited

U.S. PATENT DOCUMENTS

| | | |
|---|---|---|
| 2004/0121621 A1 | 6/2004 | Ruelke et al. |
| 2005/0124168 A1 | 6/2005 | Nagahara et al. |
| 2007/0096331 A1 | 5/2007 | Nagahara et al. |
| 2008/0254641 A1 | 10/2008 | Kobayashi et al. |
| 2009/0121359 A1 | 5/2009 | Nomura et al. |

FOREIGN PATENT DOCUMENTS

| | | |
|---|---|---|
| JP | 2006-128591 A | 5/2006 |
| JP | 2006-525651 A | 11/2006 |
| JP | 2010-272826 A | 12/2010 |

* cited by examiner

SEMICONDUCTOR DEVICE AND MANUFACTURING METHOD OF THE SAME

TECHNICAL FIELD

The present invention relates to a semiconductor device and a manufacturing method of the same, and is appropriately usable for, for example, a semiconductor device including a Cu wiring and a manufacturing method of the same.

BACKGROUND

In a recent semiconductor device, application of a Cu (copper) wiring is indispensable for a high-speed operation, low power consumption and others. The Cu wiring is formed by forming a wiring groove in an interlayer insulating film on a semiconductor substrate by using a damascene method, depositing a Cu (copper) film in the wiring groove and on the interlayer insulating film, and then selectively leaving the Cu film in the wiring groove by using a chemical mechanical polishing (CMP) method. As the interlayer insulating film, a silicon oxide film or the like is used.

Since Cu which constitutes the Cu wiring is more easily diffused into an interlayer insulating film such as a silicon oxide film than a wiring material such as Al (aluminum), a bottom surface and a side surface of the Cu wiring are covered with a conductive barrier film such as a TiN (titanium nitride) film. Also, a surface of the Cu wiring is covered with an insulating barrier film together with a surface of the adjacent interlayer insulating film.

In such a Cu wiring structure, Cu ions move along an interface between the interlayer insulating film and the insulating barrier film, so that TDDB (Time Dependence on Dielectric Breakdown) of the Cu wiring occurs. Particularly when a Cu surface is oxidized to CuO after Cu-CMP, Cu is easily ionized and the TDDB deteriorates. For the improvement of TDDB characteristics of the Cu wiring, a technique of subjecting the surfaces of the Cu wiring and the interlayer insulating film to ammonia (NH3) plasma treatment to reduce CuO on the surface of the Cu wiring to Cu, and then forming an insulating barrier film has been known.

As the interlayer insulating film, use of an insulating film having a low dielectric constant, for example, SiCOH has been examined to reduce a capacitance between wirings.

"Effective Cu Surface Pre-treatment for High-reliable 22 nm-node Cu Dual Damascene Interconnects with High Plasma resistant Ultra Low-k Dielectric (k=2.2)" (Non-Patent Document 1) discloses subjecting a Cu wiring formed on an insulating film having a low dielectric constant to ammonia plasma treatment. It also discloses that the ammonia plasma treatment forms a damage layer having a high dielectric constant such as an oxide film on a surface of an interlayer insulating film having a low dielectric constant and RC characteristics and reliability are deteriorated.

RELATED ART DOCUMENTS

Non-Patent Documents

Non-Patent Document 1: F. Ito at al., "Effective Cu Surface Pre-treatment for High-reliable 22 nm-node Cu Dual Damascene Interconnects with High Plasma resistant Ultra Low-k Dielectric (k=2.2)" Advanced Metalization Conference Oct. 5-7, 2010

SUMMARY

Problems to be Solved by the Invention

The inventors of the present invention have examined a Cu wiring using an insulating film having a low dielectric constant as an interlayer insulating film and found out the following problems.

While a semiconductor device has been miniaturized and a space between Cu wirings decreases, a power supply voltage remains substantially constant, and an electric field intensity applied to an interlayer insulating film between the Cu wirings tends to increase. Also, the Cu wiring has a tapered shape in a film thickness direction depending on its manufacturing method and an electric field applied between upper ends of the adjacent Cu wirings becomes the highest. More specifically, it can be said that an interface between the interlayer insulating film and an insulating barrier film is an area where TDDB breakdown (decrease in TDDB life) is most likely to occur.

Further, when a surface of the interlayer insulating film having a low dielectric constant is oxidized and nitrided and a damage layer is formed by ammonia plasma treatment after CMP treatment, since the dielectric constant of a damage layer portion is higher than the dielectric constant of the interlayer insulating film, an electric field is likely to concentrate on the damage layer portion, so that the TDDB life between the Cu wirings decreases (deteriorates).

Other problems and novel characteristics will be apparent from the descriptions of the present specification and appended drawings.

Means for Solving the Problems

According to an embodiment, a semiconductor device includes an interlayer insulating film, adjacent Cu wirings formed in the interlayer insulating film, and an insulating barrier film which is in contact with a surface of the interlayer insulating film and surfaces of the Cu wirings and covers the interlayer insulating film and the Cu wirings. Also, between the adjacent Cu wirings, the interlayer insulating film has a damage layer on its surface, and has an electric field relaxation layer having a higher nitrogen concentration than a nitrogen concentration of the damage layer at a position deeper than the damage layer.

Effects of the Invention

According to an embodiment, the TDDB life of a semiconductor device including Cu wirings can be improved.

DETAILED DESCRIPTION

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments.

In some drawings used in the following embodiments, hatching is omitted even in a sectional view so as to make the drawings easy to see. Also, hatching is used even in a plan view so as to make the drawings easy to see.

First Embodiment

Figure 1:
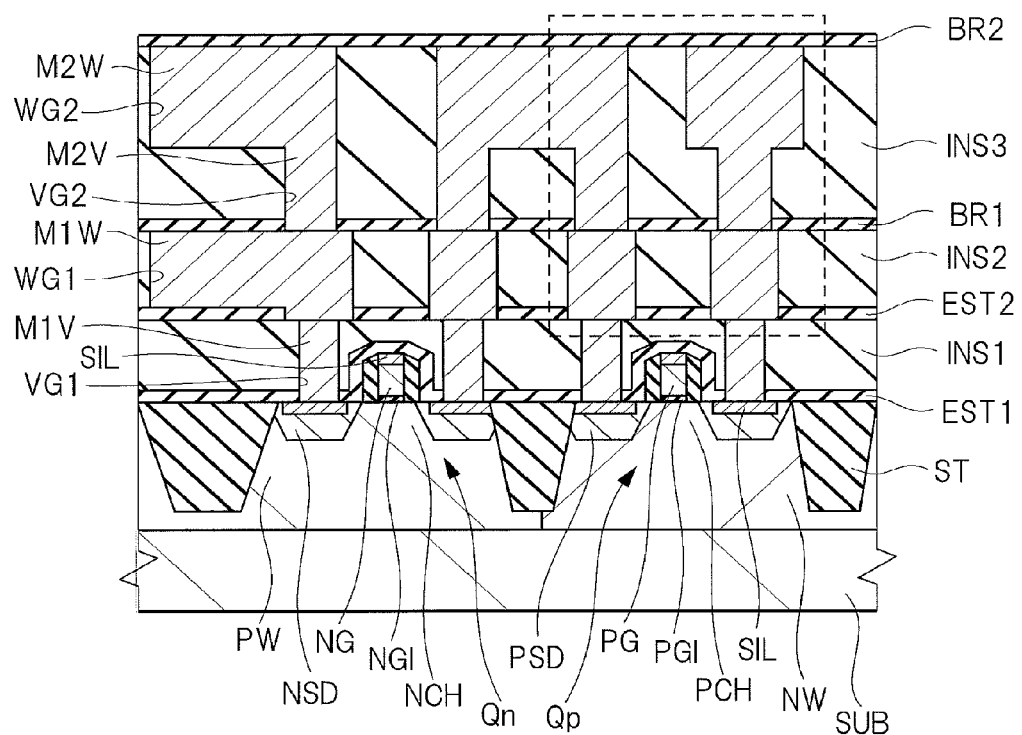
FIG. 1 is a cross-sectional view of a principal part of a semiconductor device according to an embodiment.

FIG. 1 is a cross-sectional view of a principal part showing a cross-sectional structure of a semiconductor device according to the present embodiment.

A plurality of P-type well regions PW and a plurality of N-type well regions NW are formed in a main surface (surface) of a P-type semiconductor substrate SUB made of silicon. An N-type MISFET (Metal Insulator Semiconductor Field Effect Transistor) Qn (hereinafter referred to as N-type MISFET Qn) is formed in the P-type well region PW, and a P-type MISFET Qp (hereinafter referred to as P-type MISFET Qp) is formed in the N-type well region NW. An element isolation film (element isolation region) ST made of an insulating film such as a silicon oxide film is partially formed on a surface of the semiconductor substrate SUB. The element isolation film ST defines an N-type MISFET formation region and a P-type MISFET formation region in the P-type well region PW and the N-type well region NW. More specifically, one or plural N-type MISFETs are formed in a region surrounded by the element isolation film ST in the P-type well region PW when seen in a plan view. Also, one or plural P-type MISFETs Qp are formed in a region surrounded by the element isolation film ST in the N-type well region NW when seen in a plan view. The N-type MISFET Qn includes an N-type source region NSD and an N-type drain region NSD, which are in contact with the element isolation film ST, a channel formation region NCH between the source region NSD and the drain region NSD, and a gate electrode NG formed on the channel formation region NCH via a gate insulating film NGI. Silicide films SIL are respectively formed on surfaces of the N-type source region NSD, the N-type drain region NSD, and the gate electrode NG. The P-type MISFET Qp includes a P-type source region PSD and a P-type drain region PSD, which are contact in contact with the element isolation film ST, a channel formation region PCH between the source region PSD and the drain region PSD, and a gate electrode PG formed on the channel formation region PCH via the gate insulating film PGI. Silicide films SIL are respectively formed on surfaces of the P-type source region PSD, the P-type drain region PSD, and the gate electrode PG.

The N-type MISFET Qn, the P-type MISFET Qp, and the element isolation films ST are covered with a first etching stopper film EST1 which is an insulating film made of a silicon nitride film. Further, a first interlayer insulating film INS1 which is an insulating film is formed on the first etching stopper film EST1, and the first interlayer insulating film INS1 is made of a BP (boron, phosphorus)-TEOS (Tetra Ethyl Ortho Silicate) film. A plurality of first contact holes VG1 are formed in the first etching stopper film EST1 and the first interlayer insulating film INS1, and a first plug electrode M1V which is a metal conductor film is provided in the first contact hole VG1. The first plug electrode M1V is electrically connected to the source region NSD and the drain region NSD of the N-type MISFET Qn and further the source region PSD and the drain region PSD of the P-type MISFET Qp. The first plug electrode M1V has a laminated structure of a titanium nitride (TiN) film and a tungsten (W) film. The first etching stopper film EST1 functions as an etching stopper when forming the first contact hole VG1 in the first interlayer insulating film INS1. Etching at the time of forming the first contact hole VG1 in the first interlayer insulating film INS1 is performed under the condition that the etching rate of the first interlayer insulating film INS1 is higher than the etching rate of the first etching stopper film EST1. Next, by performing the etching for forming the first contact hole VG1 in the first etching stopper film EST1 having a smaller film thickness than that of the first interlayer insulating film INS1, scraping of the semiconductor substrate SUB can be reduced.

A second etching stopper film EST2 which is an insulating film and a second interlayer insulating film INS2 which is an insulating film are sequentially formed in this order on the first interlayer insulating film INS1 and the first plug electrode M1V. The second etching stopper film EST2 is made of a silicon nitride film, and the second interlayer insulating film INS2 is made of, for example, a Low-k insulating film having a dielectric constant of 3.0 or less. The second interlayer insulating film INS2 is specifically SiCOH, and other films such as an organic polymer film (polyarylene, benzocyclobutene, polyimide, etc.), Parylene (registered trademark) or BCN (boron carbonitride) film may also be used. A plurality of first wiring grooves WG1 are provided in the second etching stopper film EST2 and the second interlayer insulating film INS2, and a first wiring M1W made of a metal conductor film is formed in the first wiring groove WG1. The first wiring M1W is a copper (Cu) wiring having a laminated structure composed of a laminated film of one or more of a titanium (Ti) film, a titanium nitride (TiN) film, a tantalum (Ta) film and a tantalum nitride (TaN) film and a copper (Cu) film. While the copper film is mainly made of copper, the copper film may contain an additive such as aluminum (Al), manganese (Mn) or palladium (Pd). The laminated film of one or more of a titanium (Ti) film, a titanium nitride (TiN) film, a tantalum (Ta) film, and a tantalum nitride (TaN) film, is positioned between the copper (Cu) film and the second interlayer insulating film INS2, and has a function of preventing copper (Cu) from being diffused into the second interlayer insulating film INS2. More specifically, the laminated film is the above-described conductive barrier film. The first wiring M1W is electrically connected to the first plug electrode M1V.

A first insulating barrier film BR1 which is an insulating film and a third interlayer insulating film INS3 which is an insulating film are sequentially formed in this order so as to cover the first wiring M1W and the second interlayer insulating film INS2. The first insulating barrier film BR1 is made of a silicon nitride film or a silicon carbonitride thin film (SiCN thin film) or a laminated film thereof. The first insulating barrier film BR1 has a function of preventing copper (Cu) constituting the first wiring M1W from being diffused into the third interlayer insulating film INS3. More specifically, the first insulating barrier film BR1 is the above-described insulating barrier film. Also, the third interlayer insulating film INS3 is made of a material similar to that of the second interlayer insulating film INS2, for example, SiCOH.

A plurality of second wiring grooves WG2 are provided in the third interlayer insulating film INS3, and a second wiring M2W made of a metal conductor film is formed in the second wiring groove WG2. A second contact hole VG2 is formed in the third interlayer insulating film INS3 and the first barrier film BR1 so as to be connected to the first wiring groove WG1, and a second plug electrode M2V made of a metal conductor film is provided in the second contact hole VG2. The second wiring M2W and the second plug electrode M2V are integrally formed of a copper (Cu) wiring having a laminated structure composed of a laminated film of one or more of a titanium (Ti) film, a titanium nitride (TiN) film, a tantalum (Ta) film and a tantalum nitride (TaN) film and a copper (Cu) film. The laminated film of one or more of a titanium (Ti) film, a titanium nitride (TiN) film, a tantalum (Ta) film, and a tantalum nitride (TaN) film is positioned between the copper (Cu) film and the third interlayer insulating film INS3, and has a function of preventing copper (Cu) from being diffused into the third interlayer insulating film INS3. More specifically, the laminated film is the above-described conductive barrier film. While the copper film is mainly made of copper, the copper film may contain an additive such as aluminum (Al), manganese (Mn), or palladium (Pd). The second wiring M2W is electrically connected to the first wiring M1W via the second plug electrode M2V. A second insulating barrier film BR2 which is an insulating film is formed so as to cover the second wiring M2W and the third interlayer insulating film INS3. The second insulating barrier film BR2 is made of a single layer film or a laminated film of a silicon nitride film and a silicon carbonitride thin film (SiCN thin film).

While only the first wiring M1W serving as the first-layer wiring and the second wiring M2W serving as the second-layer wiring are shown in the present embodiment, an additional wiring may be formed on the second wiring M2W.

The present embodiment will be described below with reference to a portion surrounded by a broken line in FIG. 1.

Figure 2:
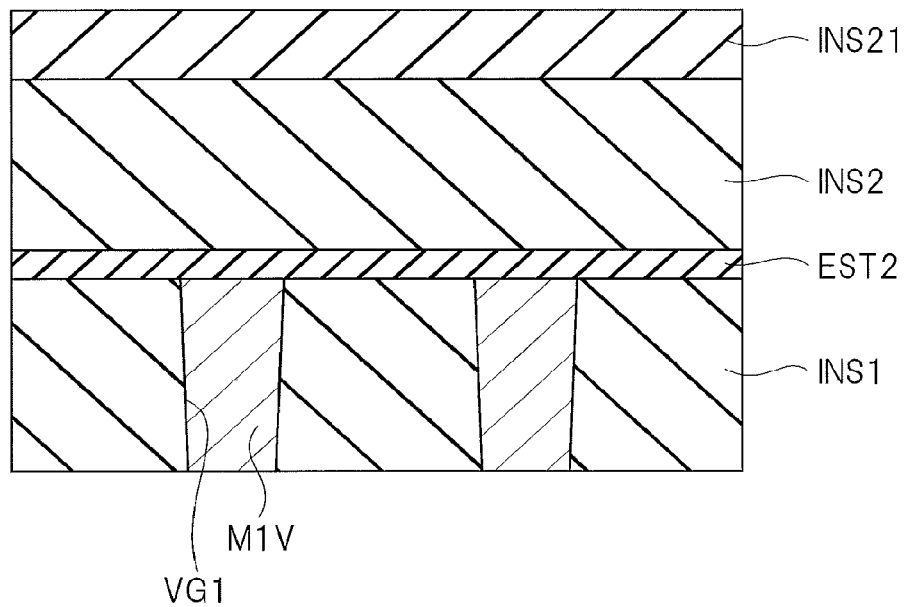
FIG. 2 is a cross-sectional view of a principal part in a manufacturing process of the semiconductor device according to the embodiment.

FIGS. 2 to 6 and FIGS. 8 to 13 are cross-sectional views of a principal part in a manufacturing process of the semiconductor device according to the present embodiment. FIG. 7 is a diagram showing a depth profile of CN-intensity by TOF-SIMS (Time Of Flight Secondary Ion Mass Spectrometry) of an SiN/SiCOH laminated structure, and FIG. 14 is a graph showing a relationship between a CN-intensity ratio between a bulk of an SiCOH film and an SiCOH surface layer portion near SiN by TOF-SIMS and an actual TDDB life between wirings in the same layer. The manufacturing method of the semiconductor device according to the present embodiment will be described below with reference also to FIG. 1. FIG. 2 is a diagram illustrating a step of forming the second interlayer insulating film INS2 and the first insulating film INS21. The semiconductor substrate SUB having an N-type MISFET Qn and a P-type MISFET Qp formed thereon is prepared, and the first interlayer insulating film INS1 made of an insulating film is formed on the semiconductor substrate SUB so as to cover the N-type MISFET Qn and the P-type MISFET Qp. Next, the first contact hole VG1 is formed in the first interlayer insulating film INS1 so as to expose the source region NSD and the drain region NSD of the N-type MISFET Qn and further the source region PSD and the drain region PSD of the P-type MISFET Qp. Next, the first plug electrode M1V is then formed in the first contact hole VG1. Next, as shown in FIG. 2, the second etching stopper film EST2 made of an insulating film, the second interlayer insulating film INS2 made of an insulating film, and the first insulating film INS21 made of an insulating film are sequentially formed in this order on the first plug electrode M1V and the first interlayer insulating film INS1. The SiCOH film constituting the second interlayer insulating film INS2 can be formed by a CVD (Chemical Vapor Deposition) method using organic silane gas (3MS: trimethylsilane, 4MS: tetramethylsilane, 1MS: monomethylsilane, 2MS: dimethylsilane) and oxidation gas ($O_2$, $N_2O$, CO, $CO_2$, etc.). The first insulating film INS21 is a film having a higher dielectric constant and a higher mechanical strength than those of the second interlayer insulating film INS2, and a silicon oxide film and an SiCOH film having a higher dielectric constant than that of the second interlayer insulating film INS2 and superior processing resistance can be used as the first insulating film INS21. The film thickness of the first insulating film INS21 is smaller than the film thickness of the second interlayer insulating film INS2.

Figure 3:
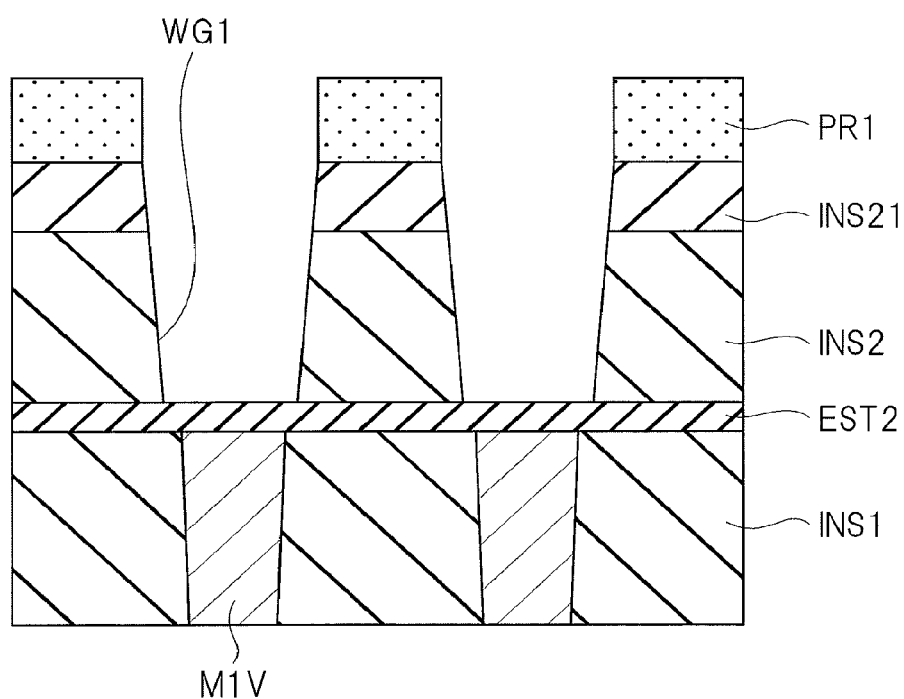
FIG. 3 is a cross-sectional view of a principal part in the manufacturing process of the semiconductor device continued from FIG. 2.

FIG. 3 is a diagram illustrating a step of forming the first wiring groove WG1. A first resist film PR1 made of an insulating film having an opening corresponding to a pattern of the first wiring M1W is formed on the first insulating film INS21. The first insulating film INS21 and the second interlayer insulating film INS2 are subjected to dry etching using the first resist film PR1 as a mask, thereby forming the first wiring groove WG1. This dry etching is performed under the condition that the etching rates of the second interlayer insulating film INS2 and the first insulating film INS21 are higher (larger) than that of the second etching stopper film EST2. The first wiring groove WG1 is formed in not only the second interlayer insulating film INS2 but also the first insulating film INS21. Also, a cross-sectional shape of the first wiring groove WG1 is a tapered shape in which the opening diameter at the top of the first wiring groove WG1 is larger than the opening diameter at the bottom thereof. More specifically, each of the first insulating film INS21 and the second interlayer insulating film INS2 between the adjacent first wiring grooves WG1 has a shape in which the width at the top thereof is smaller than that at the bottom thereof.

Figure 4:
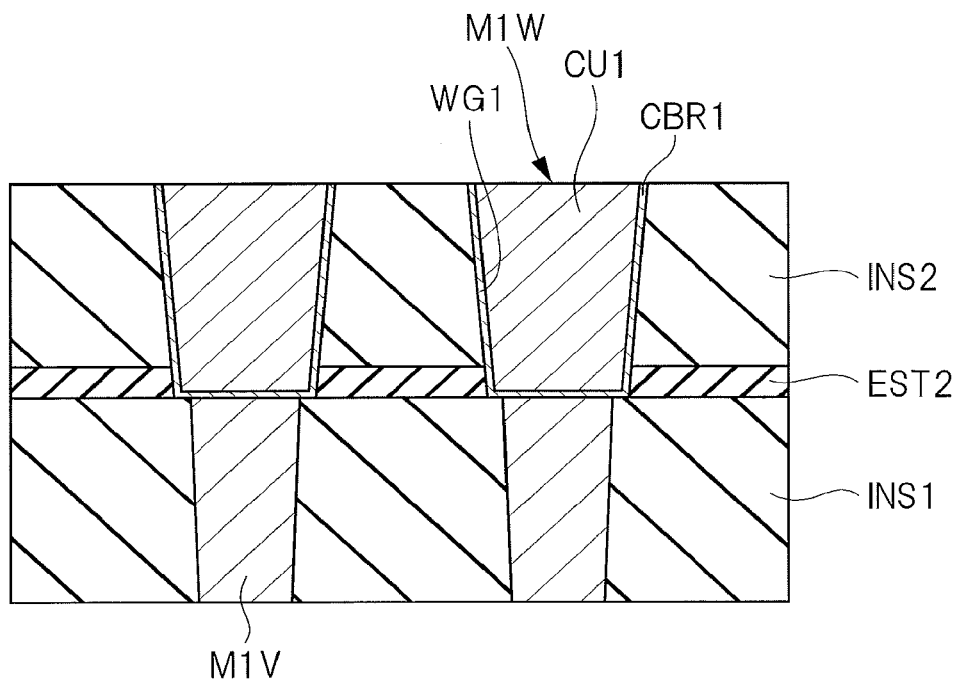
FIG. 4 is a cross-sectional view of a principal part in the manufacturing process of the semiconductor device continued from FIG. 3.

FIG. 4 is a diagram illustrating a step of forming the first wiring M1W. First, the first resist film PR1 is removed, and the second etching stopper film EST2 is then etched by blanket etch back, thereby exposing an upper surface of the first plug electrode M1V. Thereafter, a first conductive barrier film CBR1 which is a conductive film and a first copper film CU1 which is a conductive film are sequentially formed in the first wiring groove WG1, and a surface of the semiconductor substrate SUB is then subjected to CMP treatment. Then, the first conductive barrier film CBR1 and the first copper film CU1 are selectively left only in the first wiring groove WG1, and the first conductive barrier film CBR1 and the first copper film CU1 on the second interlayer insulating film INS2 are removed, thereby forming the first wiring M1W. In this CMP treatment, the first insulating film INS21 is also removed, and the structure shown in FIG. 4 can be obtained. Since the adjacent first wirings M1W are electrically separated from each other by a Low-k insulating film by leaving only the second interlayer insulating film INS2 between the adjacent first wirings M1W, the capacitance between the first wirings M1W can be reduced.

Figure 5:
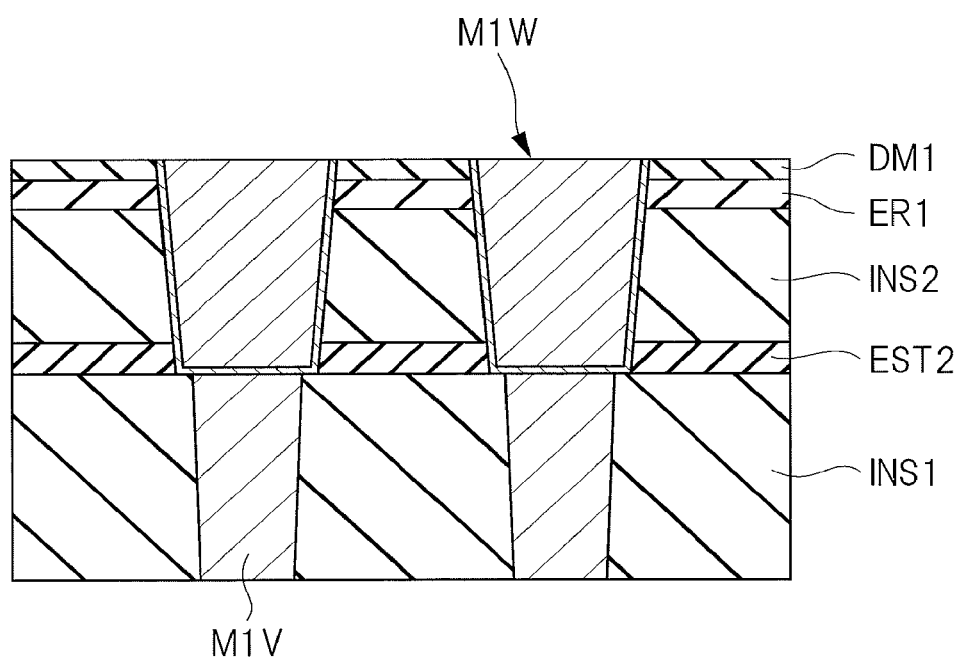
FIG. 5 is a cross-sectional view of a principal part in the manufacturing process of the semiconductor device continued from FIG. 4.

FIG. 5 is a diagram illustrating a step of ammonia plasma treatment. Surfaces of the first wiring M1W and the second interlayer insulating film INS2 are subjected to plasma treatment containing ammonia (NH3) gas. The ammonia plasma treatment is performed by using NH3 gas under the conditions of a pressure of 1.0 to 8.0 Torr, a high-frequency power of 50 W to 500 W, and a time of 3 Sec to 100 Sec. N2 gas may be added to the NH3 gas. By the ammonia plasma treatment, an oxide film (CuO) formed on a surface of the first copper film CU1 constituting the first wiring M1W in CMP treatment can be removed, and the surface of the second interlayer insulating film INS2 can be reformed (e.g., filling dangling bonds). Therefore, an adhesive property (adhesion) between the first insulating barrier film BR1 to be formed in the subsequent step and the first wiring M1W can be improved. However, since the second interlayer insulating film INS2 is made of a Low-k film, a first damage layer DM1 is formed on the surface of the second interlayer insulating film INS2 by this ammonia plasma treatment. The first damage layer DM1 is formed in a depth range of 4 nm from the surface of the second interlayer insulating film INS2. The first damage layer DM1 is a film obtained by nitriding an SiCOH film constituting the second interlayer insulating film INS2. In the present embodiment, a first electric field relaxation layer ER1 is formed below the first damage layer DM1 by the ammonia plasma treatment. The first electric field relaxation layer ER1 is also a film obtained by nitriding the SiCOH film constituting the second interlayer insulating film INS2. More specifically, the first damage layer DM1 and the first electric field relaxation layer ER1 are regions having nitrogen concentrations higher than that of the second interlayer insulating film INS2. While the first damage layer DM1 and the first electric field relaxation layer ER1 are depicted as separate portions for easy understanding in FIG. 5, both of the layers are actually integrated.

Figure 6:
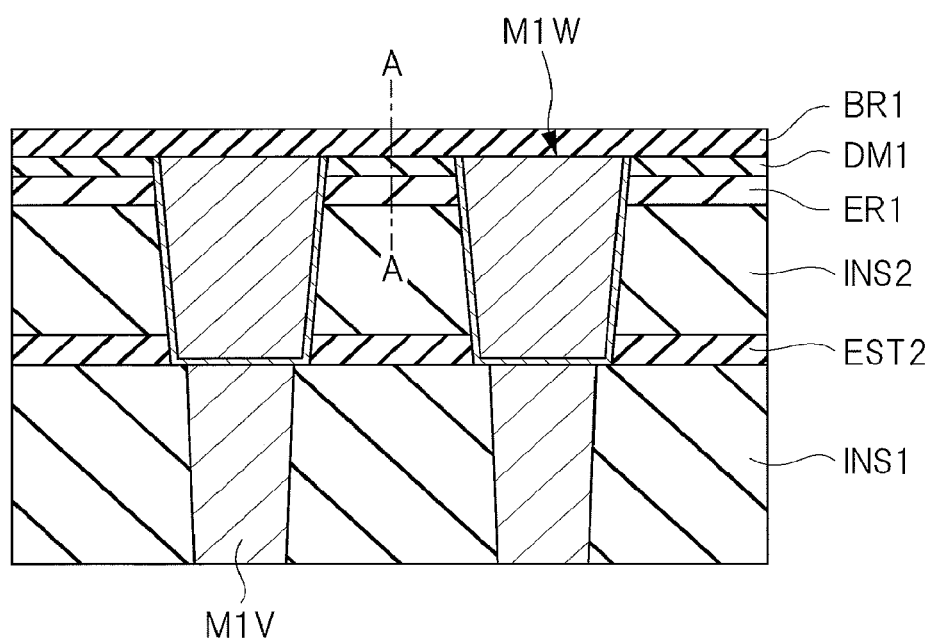
FIG. 6 is a cross-sectional view of a principal part in the manufacturing process of the semiconductor device continued from FIG. 5.
Figure 7:
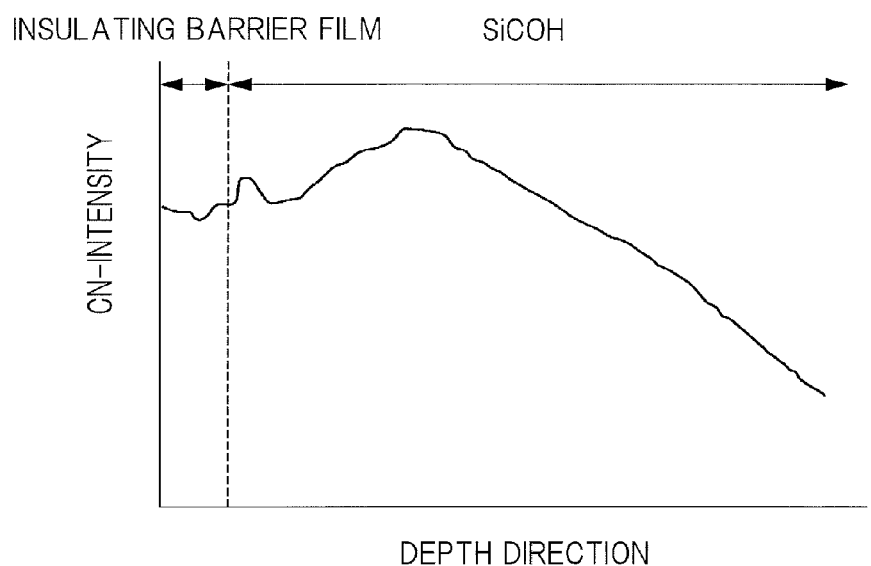
FIG. 7 is a graph showing a CN-intensity distribution of an interlayer insulating film in the semiconductor device according to the embodiment.

FIG. 6 is a diagram illustrating a step of forming the first insulating barrier film BR1. The first insulating barrier film BR1 made of an insulating film is formed so as to cover a surface of the first wiring M1W and a surface of the second interlayer insulating film INS2 from which an oxide film (CuO) has been removed by ammonia plasma treatment.

FIG. 7 is a graph showing a CN-intensity (nitrogen concentration) distribution by TOF-SIMS assuming an A-A portion shown in FIG. 6. The graph shows a result of analysis from the first insulating barrier film BR1 to a predetermined depth of the second interlayer insulating film INS2 by TOF-SIMS method, and a nitrogen concentration is represented by using the CN-intensity. The nitrogen concentration in a depth direction of the second interlayer insulating film INS2 has a concentration peak at a position deeper than the surface. The concentration peak is positioned in a range of 5 nm to 20 nm from the surface of the second interlayer insulating film INS2. A surface portion (0 to 4 nm) of the second interlayer insulating film INS2 is the first damage layer DM1, and a region having a higher nitrogen concentration than the nitrogen concentration of the surface portion is the first electric field relaxation layer ER1. A region where the nitrogen concentration gradually increases, a region where the nitrogen concentration is at its peak, and a region where the nitrogen concentration gradually decreases are present in the first electric field relaxation layer ER1. The nitrogen concentration of the first electric field relaxation layer ER1 is higher than the nitrogen concentration of the first damage layer DM1. In other words, the dielectric constant of the first electric field relaxation layer ER1 is higher than the dielectric constant of the first damage layer DM1. Thus, since a region (layer) having a higher dielectric constant than the dielectric constant of the surface of the second interlayer insulating film INS2 is provided at a position deeper than the surface (upper surface) of the second interlayer insulating film INS2 between the adjacent first wirings M1W, an electric field on the surface of the second interlayer insulating film INS2 can be relaxed. As a result, TDDB characteristics (life) between the adjacent first wirings M1W can be improved. Since an electric field relaxation effect decreases when the first electric field relaxation layer ER1 is too far from the surface of the second interlayer insulating film INS2, a peak position of the nitrogen concentration of the first electric field relaxation layer ER1 is desirably shallower than one-half of the thickness of the first wiring M1W.

Figure 8:
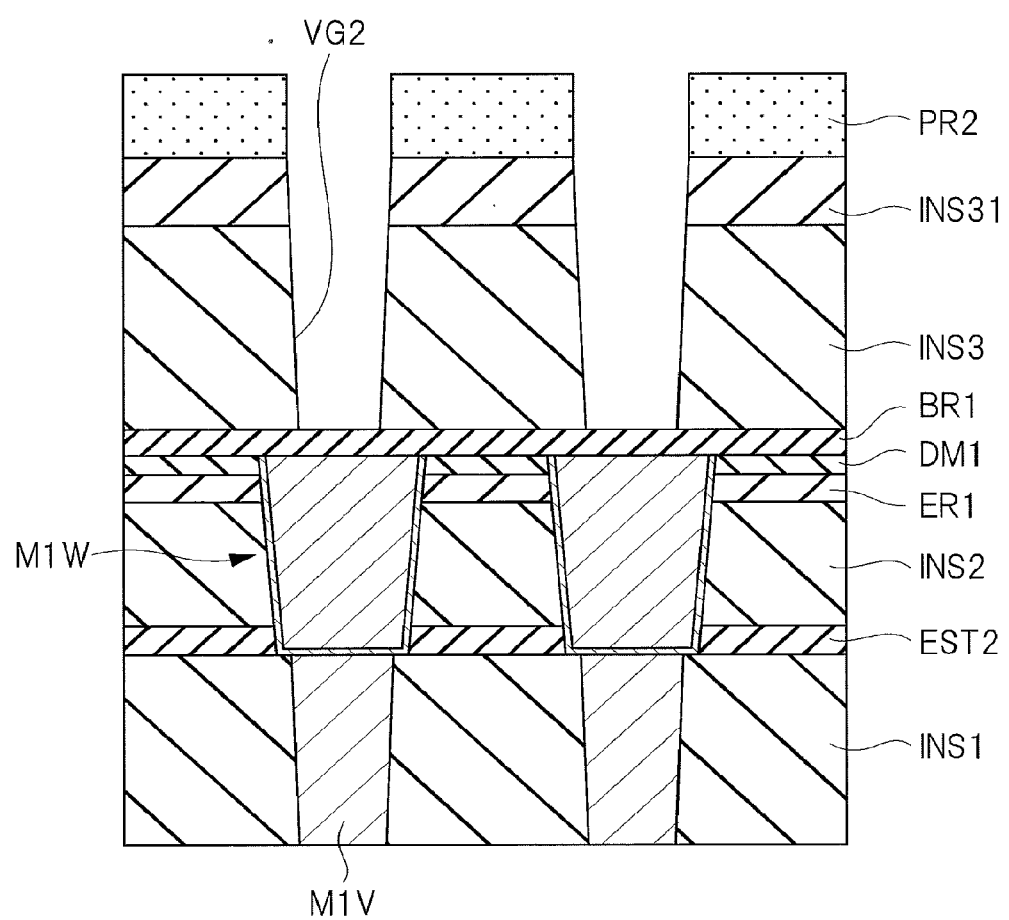
FIG. 8 is a cross-sectional view of a principal part in the manufacturing process of the semiconductor device continued from FIG. 6.

FIG. 8 is a diagram illustrating a step of forming the third interlayer insulating film INS3, the second insulating film INS31, and the second contact hole VG2. The third interlayer insulating film INS3 and the second insulating film INS31 are sequentially formed in this order on the first insulating barrier film BR1. The third interlayer insulating film INS3 and the second insulating film INS31 are made of a film similar to the second interlayer insulating film INS2 and the first insulating film INS21. Then, a second resist film PR2 made of an insulating film having an opening corresponding to the second contact hole VG2 is formed on the second insulating film INS31. As shown in FIG. 8, the second insulating film INS31 and the third interlayer insulating film INS3 are subjected to dry etching using the second resist film PR2 as a mask, thereby forming the second contact hole VG2. The etching is stopped on the first insulating barrier film BR1. Therefore, the first insulating barrier film BR1 remains at the bottom of the second contact hole VG2.

Figure 9:
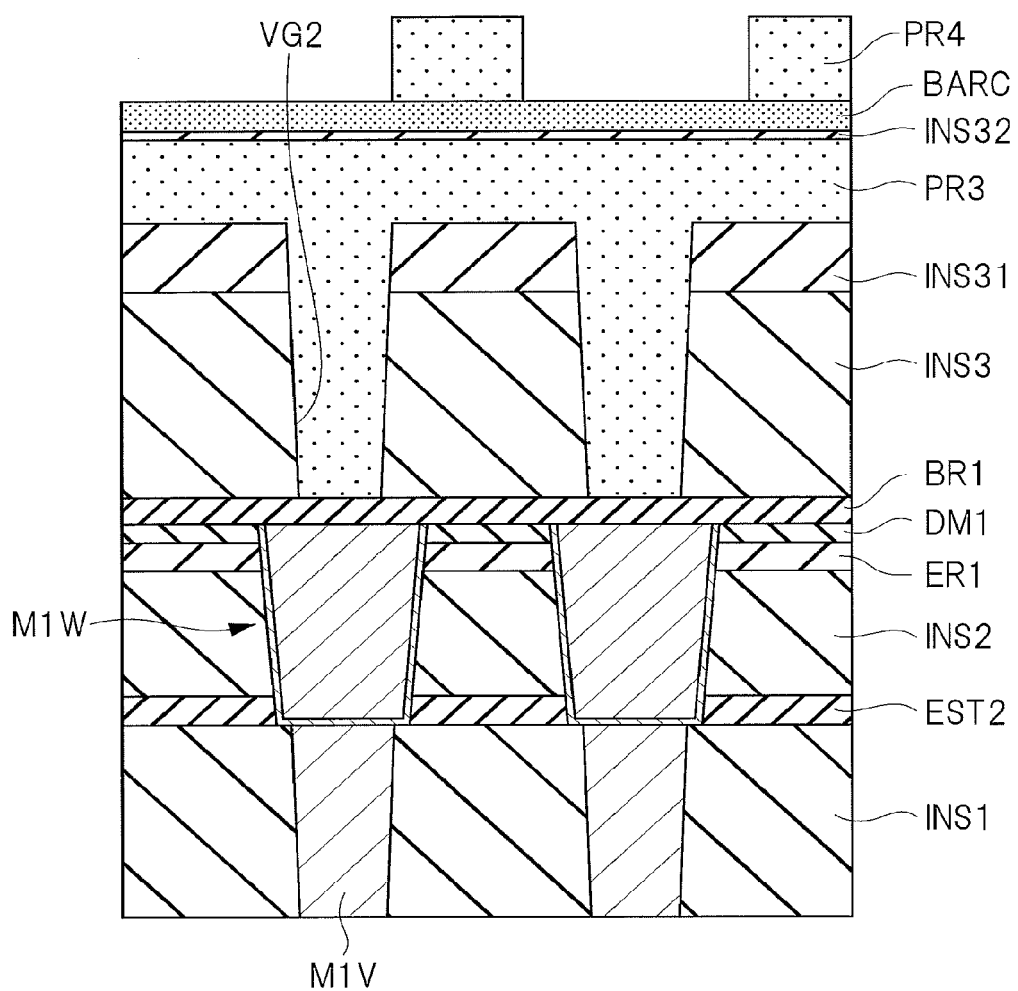
FIG. 9 is a cross-sectional view of a principal part in the manufacturing process of the semiconductor device continued from FIG. 8.

FIG. 9 is a diagram illustrating a step of forming a fourth resist film PR4 made of an insulating film for forming the second wiring groove WG2. After the second resist film PR2 is removed, a third resist film PR3 is formed in the second contact hole VG2 and on the second insulating film INS31. A third insulating film INS32 and an antireflection film BARC made of an insulating film are formed on the third resist film PR3. The third insulating film INS32 is made of a silicon oxide film, and is formed by a low-temperature CVD method. Then, the fourth resist film PR4 having an opening corresponding to the second wiring groove WG2 is formed on the antireflection film BARC.

Figure 10:
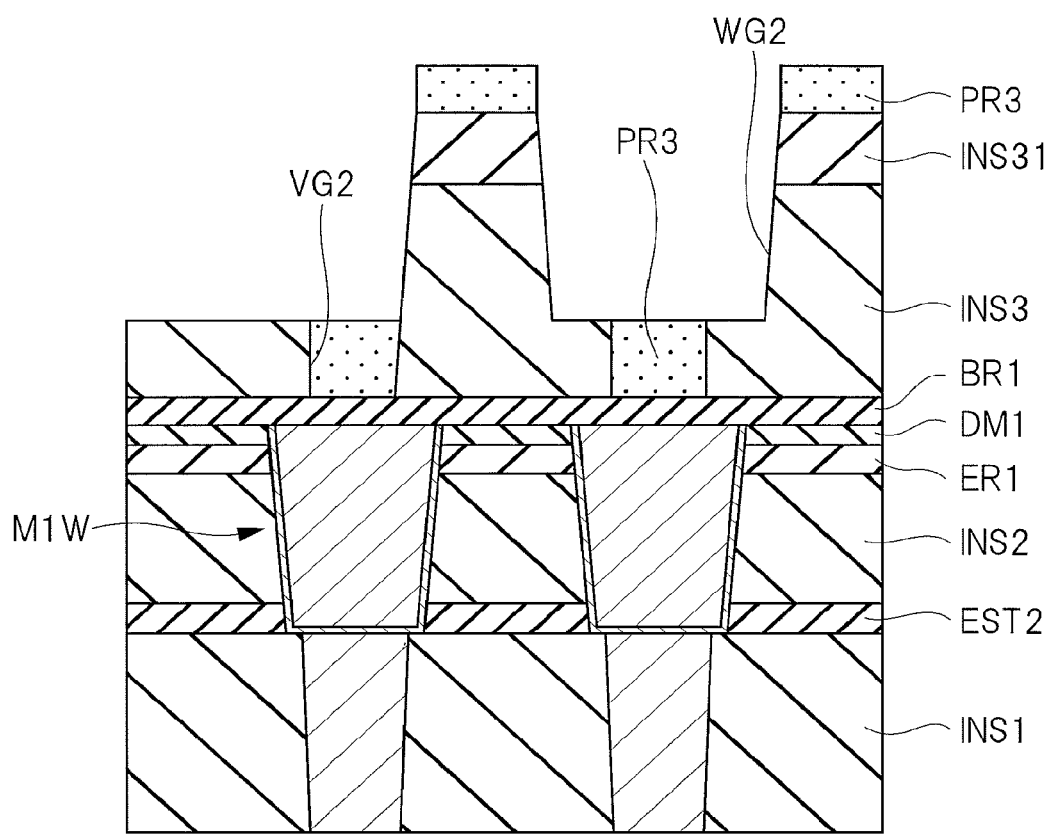
FIG. 10 is a cross-sectional view of a principal part in the manufacturing process of the semiconductor device continued from FIG. 9.

FIG. 10 is a diagram illustrating a step of forming the second wiring groove WG2. The second insulating film INS31 and the third interlayer insulating film INS3 are subjected to dry etching using the fourth resist film PR4 as a mask, thereby forming the second wiring groove WG2. At this time, the third insulating film INS32, the antireflection film BARC, and the fourth resist film PR4 formed above the third resist film PR3 are simultaneously removed, and the third resist film PR3 is left around the second wiring groove WG2 and in the second contact hole VG2 as shown in FIG. 10.

Figure 11:
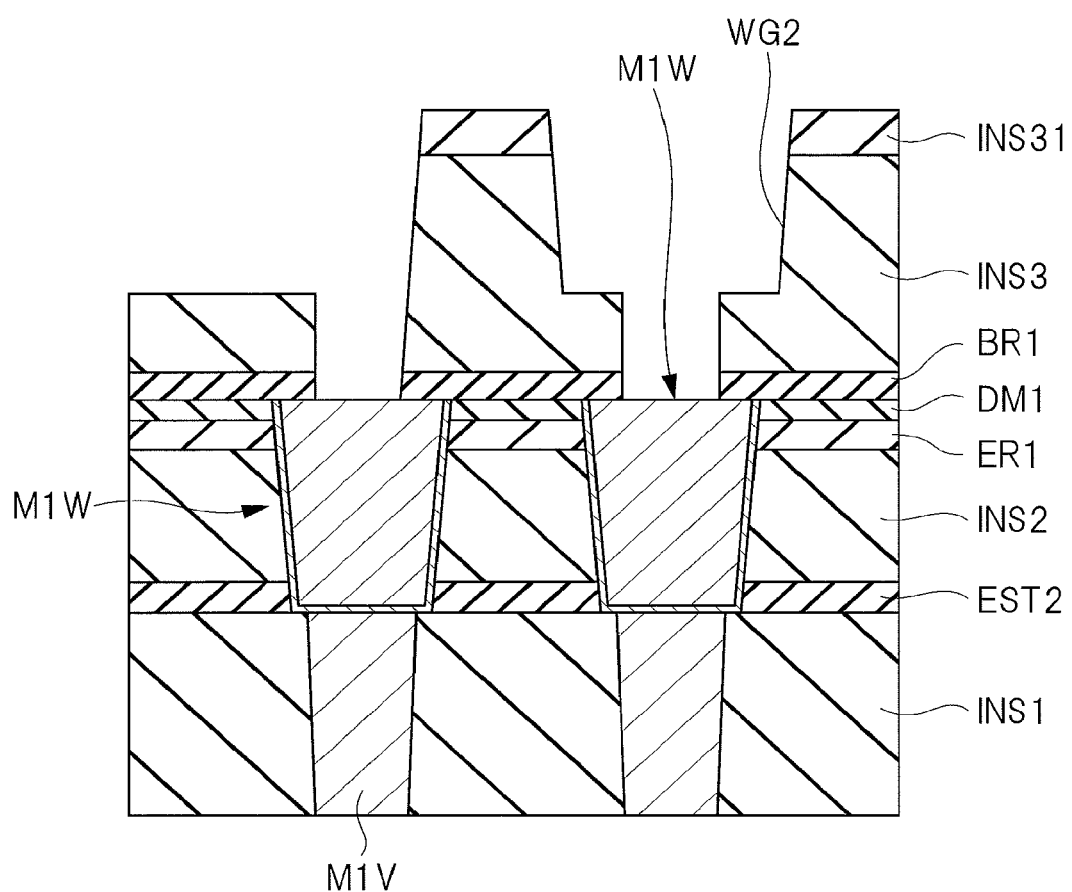
FIG. 11 is a cross-sectional view of a principal part in the manufacturing process of the semiconductor device continued from FIG. 10.

FIG. 11 is a diagram illustrating a step of removing the first barrier film BR1. First, the third resist film PR3 left around the second wiring groove WG2 and in the second contact hole VG2 is removed, and the blanket etch back is then performed in order to form an opening of the first barrier film BR1, thereby exposing a surface of the first wiring M1W as shown in FIG. 11. The second insulating film INS31 is also etched and thinned in the step of the blanket etch back.

Figure 12:
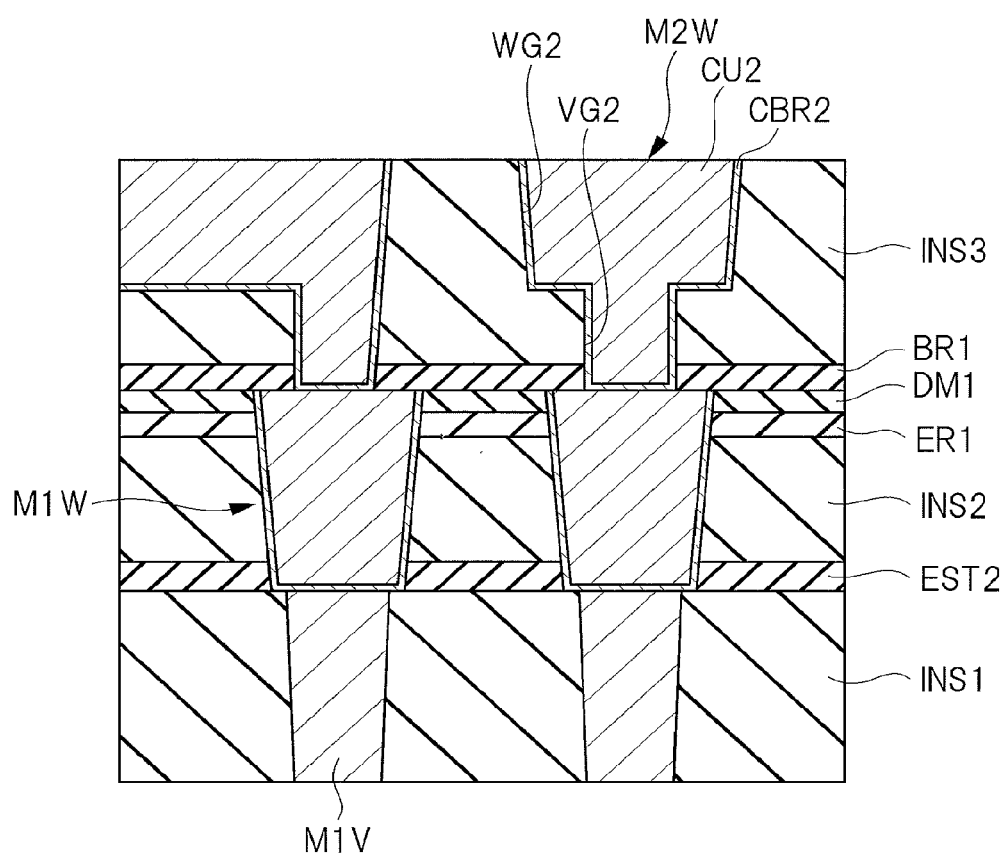
FIG. 12 is a cross-sectional view of a principal part in the manufacturing process of the semiconductor device continued from FIG. 11.

FIG. 12 is a diagram illustrating a step of forming the second wirings M2W. After a second conductive barrier film CBR2 which is a conductive film and a second copper film CU2 which is a conductive film are sequentially formed in the second contact hole VG2 and the second wiring groove WG2, a surface of the second copper film CU2 is subjected to CMP treatment. Then, the second conductive barrier film CBR2 and the second copper film CU2 are selectively left only in the second contact hole VG2 and the second wiring groove WG2, thereby forming the second wiring M2W. In this CMP treatment, the second insulating film INS31 is also removed and a surface of the third interlayer insulating film INS3 is exposed. Thus, the second wirings M2W are electrically separated from each other by a Low-k insulating film, so that a capacitance between the second wirings M2W can be reduced.

Figure 13:
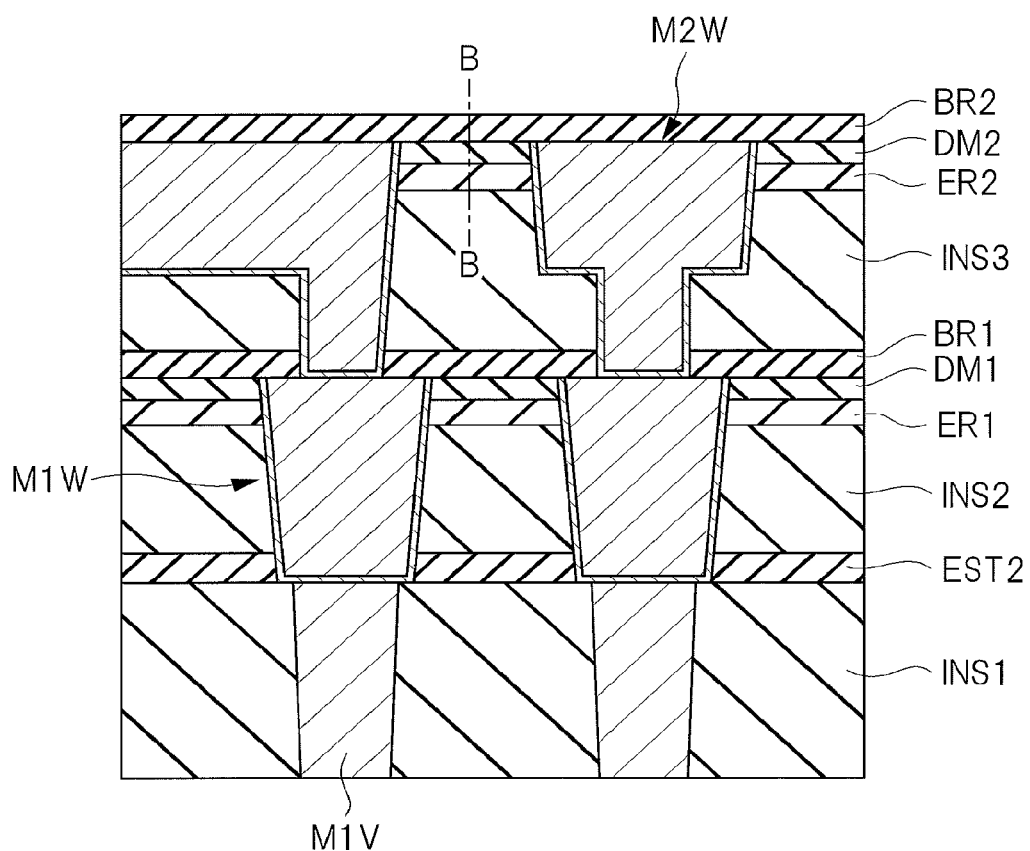
FIG. 13 is a cross-sectional view of a principal part in the manufacturing process of the semiconductor device continued from FIG. 12.
Figure 14:
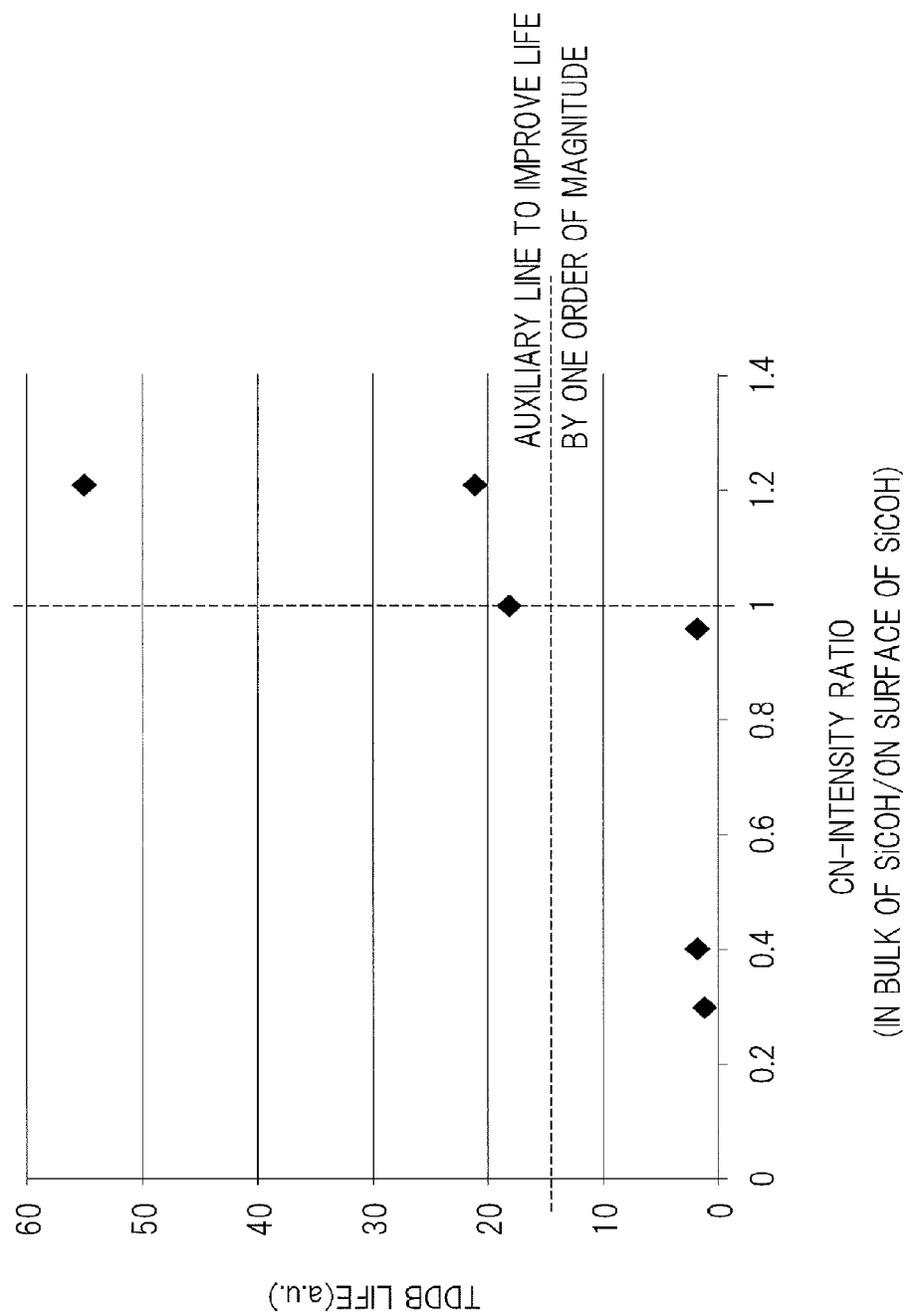
FIG. 14 is a graph showing a relationship between a CN-intensity ratio and a TDDB life of an interlayer insulating film of the semiconductor device according to the embodiment.

FIG. 13 is a diagram illustrating a step of ammonia plasma treatment and a step of forming the second insulating barrier film BR2. Surfaces of the second wiring M2W and the third interlayer insulating film INS3 are subjected to plasma treatment containing ammonia (NH3) gas. Conditions for the ammonia plasma treatment are similar to those of the first wiring M1W. By this ammonia plasma treatment, a second damage layer DM2 is formed on the surface of the third interlayer insulating film INS3. The second damage layer DM2 is formed in a depth range of 4 nm from the surface of the third interlayer insulating film INS3. The second damage layer DM2 is a film obtained by nitriding an SiCOH film constituting the third interlayer insulating film INS3. In the present embodiment, a second electric field relaxation layer ER2 is formed below the second damage layer DM2 by the ammonia plasma treatment. The second electric field relaxation layer ER2 is also a film obtained by nitriding the SiCOH film constituting the third interlayer insulating film INS3. More specifically, the second damage layer DM2 and the second electric field relaxation layer ER2 are regions having a nitrogen concentration higher than that of the third interlayer insulating film INS3. While the second damage layer DM2 and the second electric field relaxation layer ER2 are depicted as separate portions for easy understanding in FIG. 13, both of the layers are actually integrated. Then, the second insulating barrier film BR2 made of an insulating film is formed so as to cover the third interlayer insulating film INS3 and the second wiring M2W, thereby obtaining the structure shown in FIG. 13. A nitrogen concentration distribution in a portion B-B shown in FIG. 13 is similar to that that in the graph shown in FIG. 7. Since the second electric field relaxation layer ER2 has a configuration similar to that of the first electric field relaxation layer ER1, the second electric field relaxation layer ER2 produces an effect similar to that of the first electric field relaxation layer ER1. Repetitive descriptions are omitted so as to avoid redundancy, but the paragraph for describing FIG. 7 can be read by replacing the second interlayer insulating film INS2 with the third interlayer insulating film INS3, replacing the first damage layer DM1 with the second damage layer DM2, replacing the first electric field relaxation layer ER1 with the second electric field relaxation layer ER2, and replacing the first wiring M1W with the second wiring M2W.

FIG. 14 is a graph illustrating an effect of the present embodiment. FIG. 14 shows a relationship between a CN-intensity ratio (nitride concentration ratio) between an inner part and a surface of an SiCOH film constituting an interlayer insulating film and a TDDB life. When the CN-intensity ratio becomes 1 or more, the TDDB life is improved by one or more orders of magnitude. More specifically, the TDDB life is improved by one or more orders of magnitude by providing a layer having a higher nitrogen concentration than the nitrogen concentration of the surface of the interlayer insulating film in the inner part of the interlayer insulating film. In other words, a TDDB life between the adjacent first wirings M1W is improved by one or more orders of magnitude by providing the first electric field relaxation layer ER1 having a higher nitrogen concentration than the nitrogen concentration of the first damage layer DM1. Similarly, a TDDB life between the adjacent second wirings M2W is improved by one or more orders of magnitude by providing the second electric field relaxation layer ER2.

Second Embodiment

Figure 15:
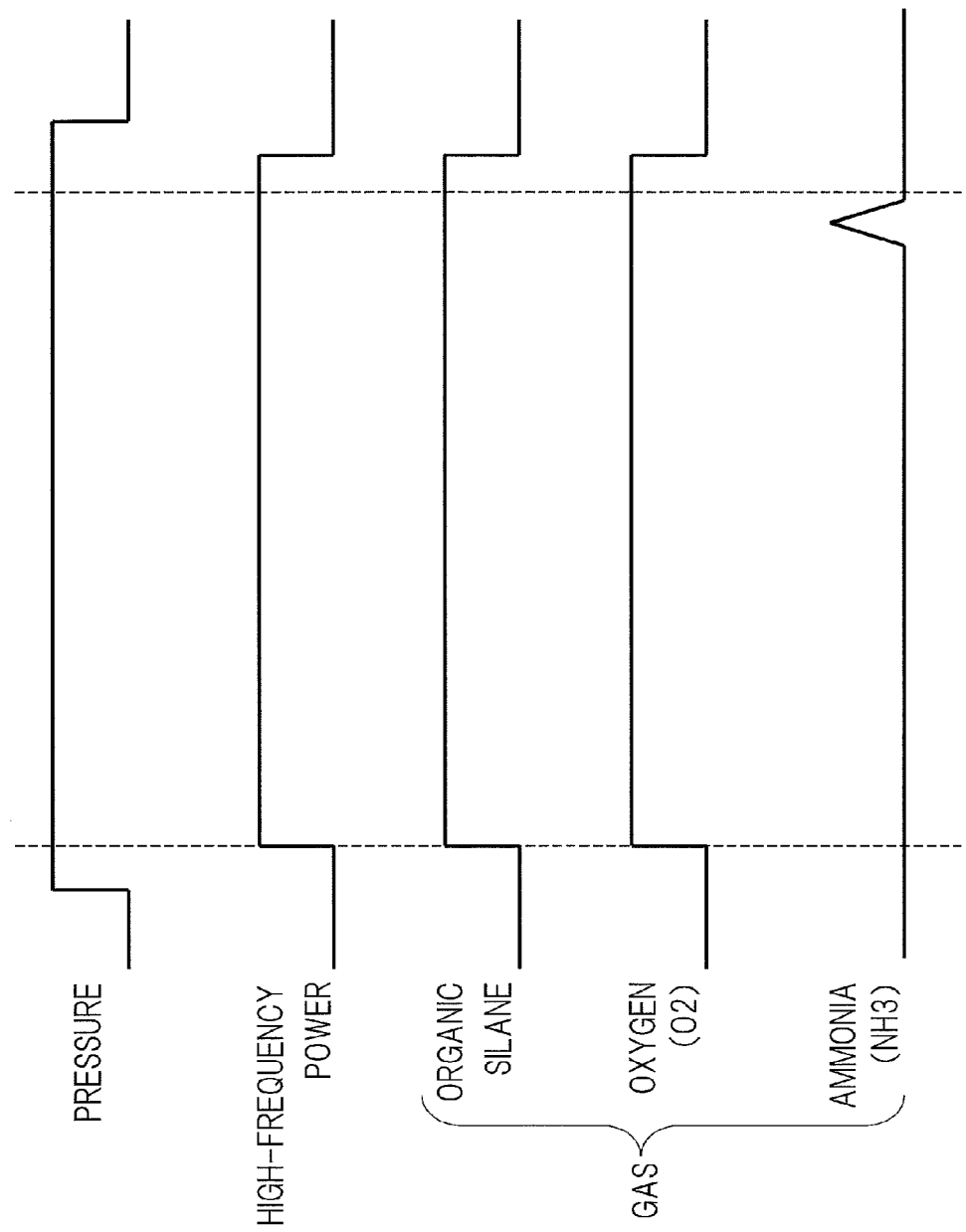
FIG. 15 is a diagram showing a gas flow relating to a manufacturing method of a semiconductor device according to a second embodiment.
Figure 16:
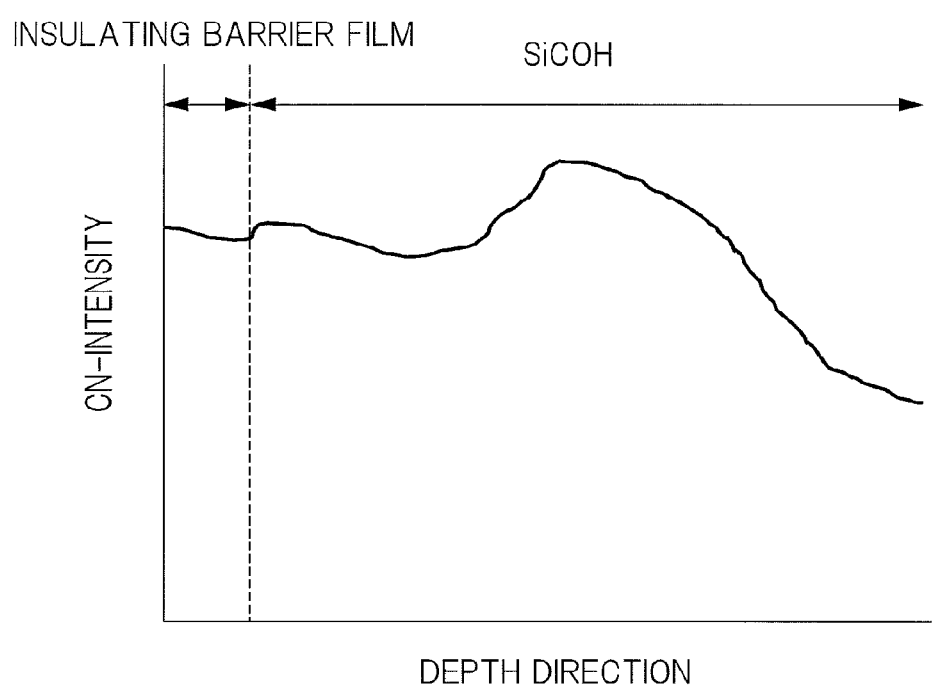
FIG. 16 is a graph showing a CN-intensity distribution of an interlayer insulating film according to the second embodiment.

The second embodiment is a modified example of the above-mentioned first embodiment, and is similar to the first embodiment except for a method of forming the first electric field relaxation layer ER1 and the second electric field relaxation layer ER2 and conditions for the ammonia plasma treatment. In the present second embodiment, the first electric field relaxation layer ER1 is formed during the step of forming the second interlayer insulating film INS2, and the second electric field relaxation layer ER2 is formed during the step of forming the third interlayer insulating film INS3. Therefore, the first damage layer DM1 and the second damage layer DM2 are formed in the step of the ammonia plasma treatment, but the first electric field relaxation layer ER1 and the second electric field relaxation layer ER2 are not formed. FIG. 15 is a diagram showing a gas flow at the time of forming the second interlayer insulating film INS2 and the third interlayer insulating film INS3, and FIG. 16 is a graph showing a CN-intensity (nitrogen concentration) distribution by Time Of Flight Secondary Ion Mass Spectrometry (TOF-SIMS) in the portion A-A shown in FIG. 6 and the portion B-B shown in FIG. 13.

An SiCOH film constituting the second interlayer insulating film INS2 is formed by a CVD method using organic silane gas (3MS: trimethylsilane, 4MS: tetramethylsilane, 1MS: monomethylsilane, 2MS: dimethylsilane) and oxidation gas (O2, N2O, CO, CO2, etc.). The present second embodiment is characterized in that gas containing nitrogen (N2, NH3, etc.) is added at a predetermined timing. Other conditions for CVD are a temperature in a range of 300 to 400° C., a pressure in a range of 1.0 to 8.0 Torr, and a high-frequency power in a range of 100 W to 500 W. As shown in FIG. 15, under stable pressure, organic silane gas and oxygen (O2) gas are caused to flow, and a power is simultaneously applied. Ammonia (NH3) gas is added in a latter half of CVD growth, and a flow rate is slowly increased. When the flow rate reaches a set value, it is slowly decreased to zero. Then, organic silane gas and oxygen (O2) gas are caused to flow, and a power is simultaneously turned off. By performing the above-mentioned flow of the ammonia (NH3) gas, the gradationally changing nitrogen concentration can be obtained in the film. By such a manufacturing method, the first electric field relaxation layer ER1 can be formed at a deeper position than the surface of the second interlayer insulating film INS2. By applying this method also to the third interlayer insulating film INS3, the second electric field relaxation layer ER2 can be formed at a deeper position than the surface of the third interlayer insulating film INS3 when forming the third interlayer insulating film INS3. Conditions for the ammonia plasma treatment to the surfaces of the second interlayer insulating film INS2 and the third interlayer insulating film INS3 differ from those in the first embodiment. It is preferable that the nitrogen concentrations of the first damage layer DM1 and the second damage layer DM2 which are generated by the ammonia plasma treatment are lower than those of the electric field relaxation layers ER1 and ER2 when forming the second interlayer insulating film INS2 and the third interlayer insulating film INS3. For example, hydrogen gas is desirably added at the time of the ammonia plasma treatment.

According to the second embodiment, a structure similar to the structures described with reference to FIGS. 6 and 13 in the first embodiment can be formed. Here, the CN-intensity (nitrogen concentration) in the A-A portion shown in FIG. 6 and the B-B portion shown in FIG. 13 obtained in the present second embodiment is shown in FIG. 16. For example, though descriptions will be made for the A-A portion shown in FIG. 6, a similar effect can be obtained also in the B-B portion shown in FIG. 13. Like the first embodiment, a region where the nitrogen concentration gradually increases, a region where the nitrogen concentration is at its peak, and a region where the nitrogen concentration gradually decreases are present in the first electric field relaxation layer ER1. The nitrogen concentration of the first electric field relaxation layer ER1 is higher than the nitrogen concentration of the first damage layer DM1. In other words, the dielectric constant of the first electric field relaxation layer ER1 is higher than the dielectric constant of the first damage layer DM1.

Since the first electric field relaxation layer ER1 is formed in a step different from that of the first damage layer DM1, the damage by the ammonia plasma treatment on the surface of the second interlayer insulating film INS2 can be reduced. Therefore, a TDDB life between the adjacent first wirings M1W can be more improved than that in the first embodiment. Also, the position of the first electric field relaxation layer ER1 in the second interlayer insulating film INS2, that is, the peak of the nitrogen concentration can be easily controlled. The fact that the nitrogen concentration has the peak at a position deeper than the interface between the first insulating barrier film BR1 and the second interlayer insulating film INS2 means that the dielectric constant becomes high at that position and the electric field does not concentrate at the interface between the first insulating barrier film BR1 and the second interlayer insulating film INS2. As a result, TDDB between wirings can be improved.

Figure 17:
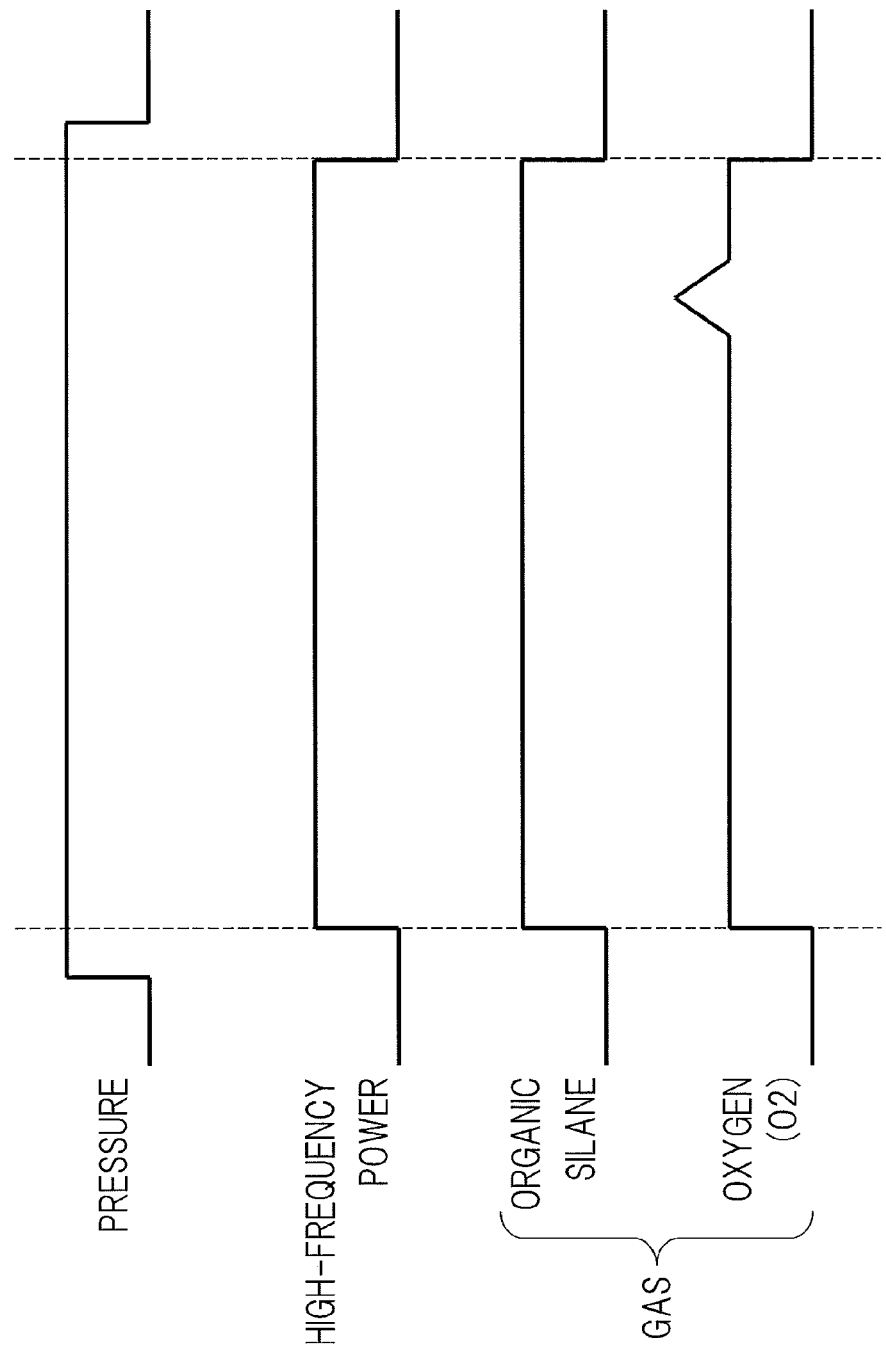
FIG. 17 is a diagram showing a modified example of a gas flow relating to the manufacturing method of the semiconductor device according to the second embodiment.

FIG. 17 is a diagram showing a modified example of a gas flow in a method of forming the second interlayer insulating film INS2 in the present second embodiment. This modified example is applicable also to the third interlayer insulating film INS3. The modified example is characterized in that the flow rate of O2 gas is changed instead of adding ammonia gas. As shown in FIG. 17, under stable pressure, organic silane gas and oxygen (O2) gas are caused to flow, and a high-frequency power is simultaneously applied. The flow rate of the oxygen (O2) gas is further slowly increased in a latter half of CVD growth, and when the flow rate reaches a set value, it is slowly decreased to its original set value. Thereafter, the power is turned off simultaneously with the organic silane gas and the oxygen (O2) gas. By performing the above-mentioned flow, the gradationally changing oxygen concentration can be obtained in the film. By such a manufacturing method, the first electric field relaxation layer ER1 can be formed at a deeper position than the surface of the second interlayer insulating film INS2. This manufacturing method is applicable also to the third interlayer insulating film INS3. As a result, the semiconductor device having the structure shown in FIG. 13 in the first embodiment can be formed. However, the difference from the first embodiment lies in that the first electric field relaxation layer ER1 is made of a layer having a higher oxygen concentration than the oxygen concentration of the second interlayer insulating film INS2. Since the dielectric constant of the first electric field relaxation layer ER1 is higher than the dielectric constant of the second interlayer insulating film INS2, an electric field on the surface of the second interlayer insulating film INS2 between the adjacent first wirings M1W can be relaxed by disposing the first electric field relaxation layer ER1 having a higher dielectric constant than the dielectric constant of the second interlayer insulating film INS2 at a deeper position than the surface of the second interlayer insulating film INS2. As a result, a TDDB life between the adjacent first wirings M1W can be improved. It is preferable that the peak position of the oxygen concentration of the first electric field relaxation layer ER1 is shallower than one-half of the thickness of the first wiring M1W. It is also preferable that the peak position of the oxygen concentration of the second electric field relaxation layer ER2 is shallower than one-half of the thickness of the second wiring M2W.

Third Embodiment

The present third embodiment is a modified example of the above-mentioned second embodiment, and is similar to the second embodiment except for a method of forming the first electric field relaxation layer ER1 and the second electric field relaxation layer ER2. In the third embodiment, the first electric field relaxation layer ER1 is formed after a step of forming the second interlayer insulating film INS2, and the second electric field relaxation layer ER2 is formed after a step of forming the third interlayer insulating film INS3. More specifically, by implanting nitrogen ions into a predetermined depth from the surface of the second interlayer insulating film INS2 after forming the second interlayer insulating film INS2, the first electric field relaxation layer ER1 is formed at a deeper position than the surface of the second interlayer insulating film INS2. A similar method is applicable also to the third interlayer insulating film INS3.

Figure 18:
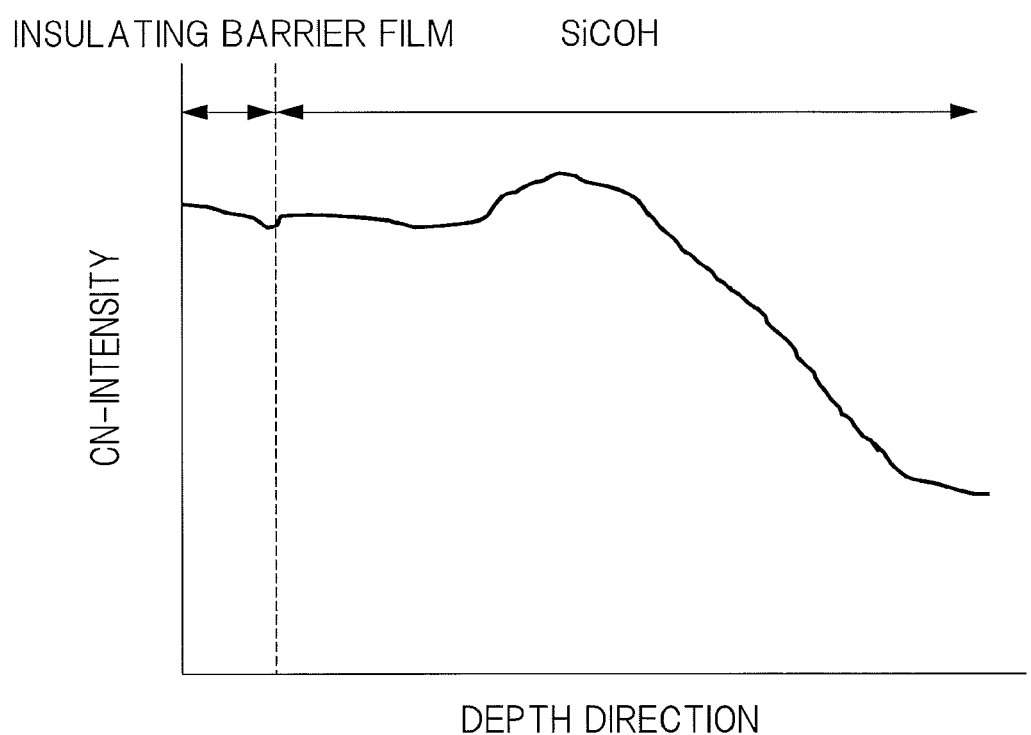
FIG. 18 is a graph showing a CN-intensity distribution of an interlayer insulating film according to a third embodiment.

According to the third embodiment, a structure similar to those described with reference to FIGS. 6 and 13 in the first embodiment can be formed. FIG. 18 is a graph showing a CN-intensity (nitrogen concentration) distribution by Time Of Flight Secondary Ion Mass Spectrometry (TOF-SIMS) in the portion A-A shown in FIG. 6 and the portion B-B shown in FIG. 13. For example, the first electric field relaxation layer ER1 having a higher nitrogen concentration than the nitrogen concentration of the first damage layer DM1 on the surface of the second interlayer insulating film INS2 is present at a deeper position than the first damage layer DM1. A peak portion of the nitrogen concentration is present in the first electric field relaxation layer ER1. The third embodiment has the advantage that controllability of a depth direction and a concentration of a nitrogen element is superior to the second embodiment. A similar effect can be obtained also in the portion B-B shown in FIG. 13.

Fourth Embodiment

The present fourth embodiment is a modified example of the above-mentioned first embodiment, and has the following differences. First, the first insulating barrier film BR1 is made of a first sub-insulating barrier film BR11 and a second sub-insulating barrier film BR12, and the second insulating barrier film BR2 is made of a first sub-insulating barrier film BR21 and a second sub-insulating barrier film BR22. The first electric field relaxation layer ER1 in the second interlayer insulating film INS2 and the second electric field relaxation layer ER2 in the third interlayer insulating film INS3 are not formed.

Figure 19:
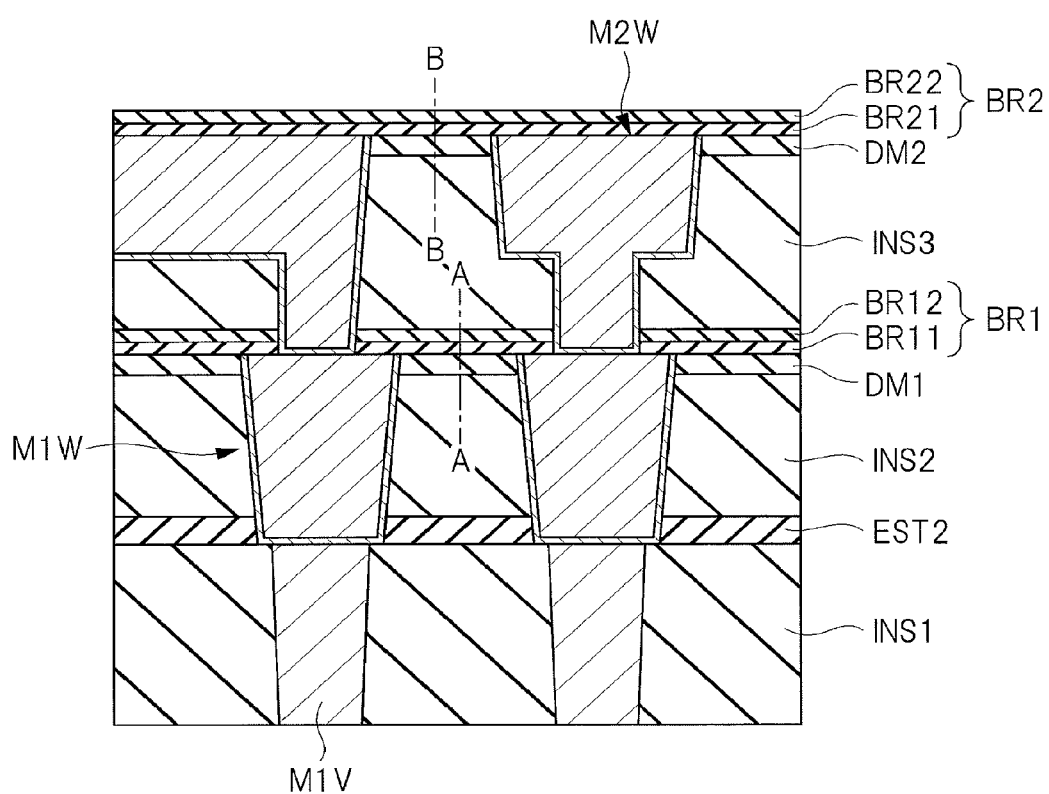
FIG. 19 is a cross-sectional view of a principal part of a semiconductor device according to a fourth embodiment.

FIG. 19 shows a cross-section structure of a principal part of a semiconductor device according to the present fourth embodiment. Description will be made by using the first insulating barrier film BR1 covering the first wiring M1W. The first insulating barrier film BR1 is made of the first sub-insulating barrier film BR11 covering the first wiring M1W and the second sub-insulating barrier film BR12 formed on the first sub-insulating barrier film BR11. The second sub-insulating barrier film BR12 has a higher nitrogen concentration than the nitrogen concentration of the first sub-insulating barrier film BR11. In particular, the second sub-insulating barrier film BR12 has a higher nitrogen concentration than the nitrogen concentration of a lower surface (interface with the first wiring M1W) of the first sub-insulating barrier film BR11. While the first sub-insulating barrier film BR11 and the second sub-insulating barrier film BR12 are depicted as separate portions for easy understanding in FIG. 19, both of the films are actually integrated.

Figure 20:
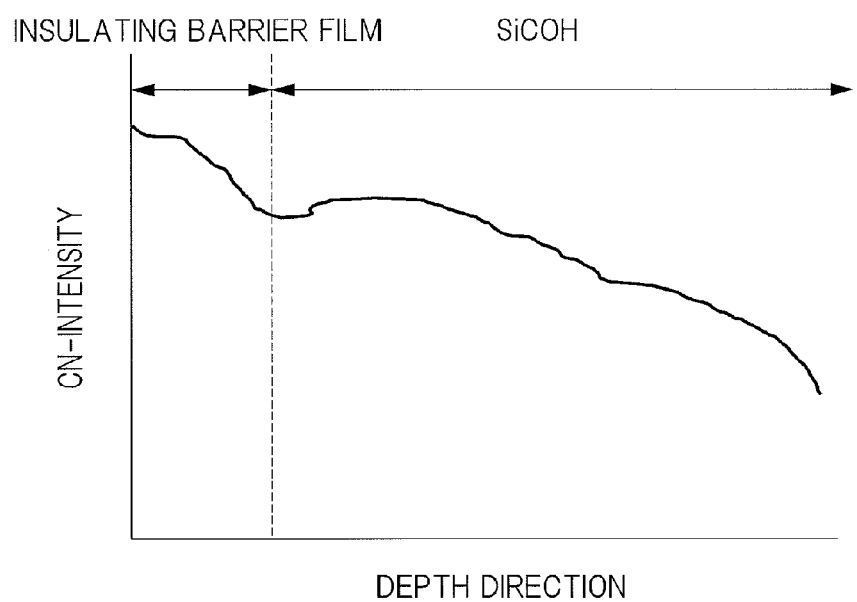
FIG. 20 is a graph showing a CN-intensity distribution of an insulating barrier film according to the fourth embodiment.

FIG. 20 is a graph showing a CN-intensity (nitrogen concentration) distribution by Time of Flight Secondary Ion Mass Spectrometry (TOF-SIMS) in the portion A-A shown in FIG. 19. The nitrogen concentration of the first insulating barrier film BR1 at a position spaced apart from an interface between the second interlayer insulating film INS2 positioned between the first wirings M1W and the first insulating barrier film BR1 formed thereon is higher than the nitrogen concentration at the interface. More specifically, the second sub-insulating barrier film BR12 is present at the position spaced apart from the interface. The nitrogen concentration of the first insulating barrier film BR1 increases as the distance from the interface between the second interlayer insulating film INS2 and the first insulating barrier film BR1 formed thereon.

Figure 21:
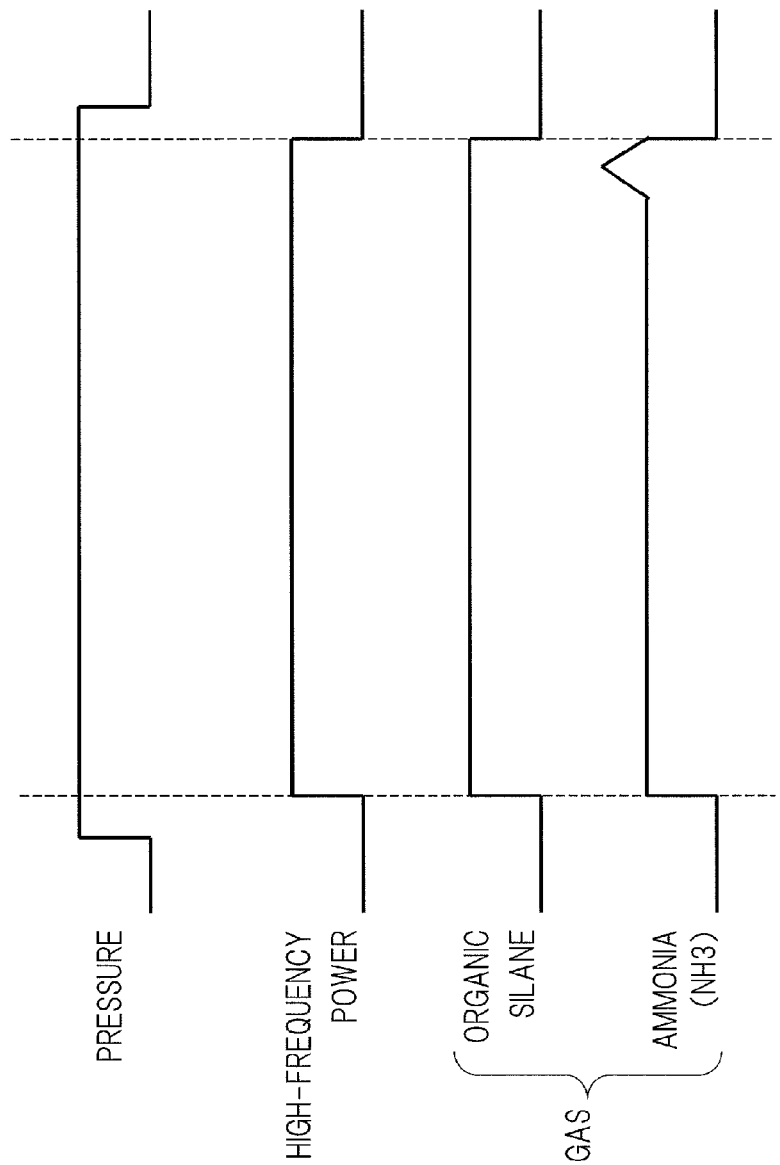
FIG. 21 is a diagram showing a gas flow relating to a manufacturing method of a semiconductor device according to the fourth embodiment.

For example, an SiCN film is used as the first insulating barrier film BR1. The SiCN film is formed by, for example, a CVD method and is used in a temperature range of 300 to 400° C., a pressure range of 1.0 to 8.0 Torr, and a high-frequency power range of 50 W to 1000 W. Organic silane, SiH4, ammonia (NH3), CO, CO2, N2O, or the like is used as gas. FIG. 21 is a diagram showing a gas flow when an SiCN film constituting the first insulating barrier film BR1 is formed by using organic silane gas and ammonia (NH3) gas. Under stable pressure, organic silane gas and ammonia (NH3) gas are caused to flow, and a power is simultaneously applied. The flow rate of the ammonia (NH3) gas is slowly increased at the end of CVD growth, and when the flow rate reaches a set value, it is slowly decreased to its original set value. Thereafter, the power, the organic silane gas and the ammonia (NH3) gas are turned off simultaneously. By performing the above-mentioned ammonia (NH3) gas flow, the gradationally changing nitrogen concentration can be obtained in the first insulating barrier film BR1.

The nitrogen concentration of the first insulating barrier film BR1 at a position spaced apart from an interface between the second interlayer insulating film INS2 positioned between the first wirings M1W and the first insulating barrier film BR1 formed thereon is made higher than the nitrogen concentration at the interface, so that a TDDB life between the adjacent first wirings M1W can be improved. This is because an electric field between the adjacent first wirings M1W at the interface portion can be relaxed by providing the region having a high nitrogen concentration in the first insulating barrier film BR1 at the position spaced apart from the interface.

Figure 22:
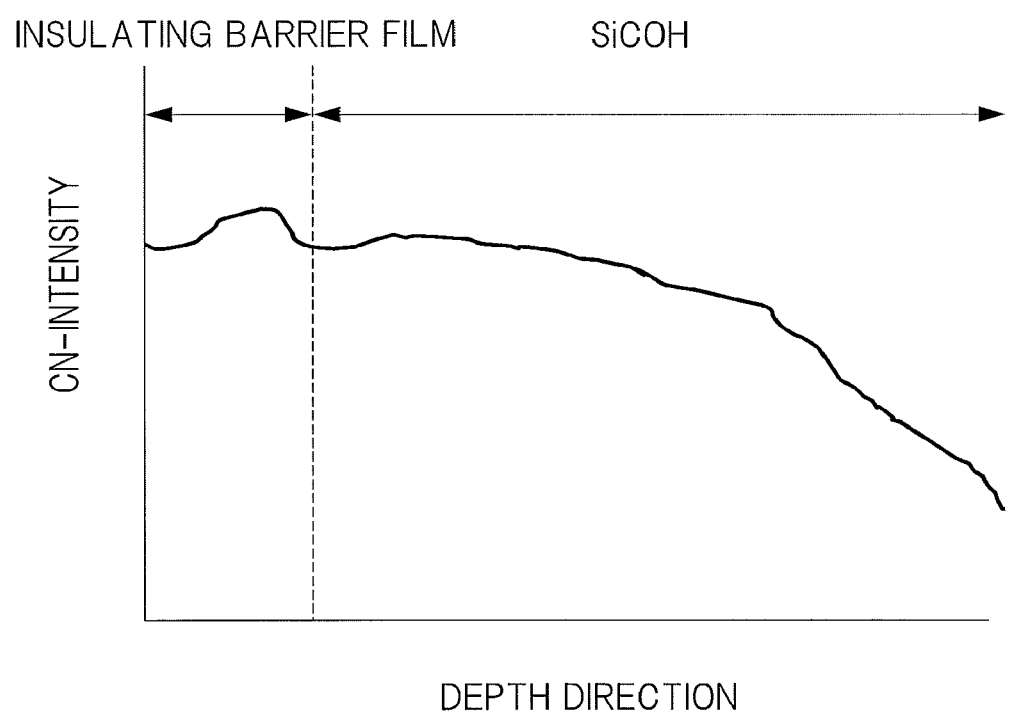
FIG. 22 is a graph showing a modified example of the CN-intensity distribution of the insulating barrier film according to the fourth embodiment.

FIG. 22 is a graph showing a CN-intensity (nitrogen concentration) distribution by Time of Flight Secondary Ion Mass Spectrometry (TOF-SIMS) in the portion A-A shown in FIG. 19. This is a modified example of the example described with reference to FIG. 20. A structure in which a region having a peak of the nitrogen concentration is present in the second sub-insulating barrier film BR12 formed on the first sub-insulating barrier film BR11 and the peak of the nitrogen concentration is present in a range of 5 to 40 nm from the lower surface of the first insulating barrier film BR1 is desirable. The second insulating barrier film BR2 also has a similar structure and a similar effect. This structure is desirable because breakdown resistance when one film has a peak of the nitrogen concentration is higher than that when an interface has a peak of the nitrogen concentration.

In the foregoing, the invention made by the inventors of the present invention has been concretely described based on the embodiments. However, it is needless to say that the present invention is not limited to the foregoing embodiments, various modifications and alterations can be made within the scope of the present invention, and the embodiments can be appropriately combined. For example, the fourth embodiment can be combined with the first to third embodiments.

Also, the present application includes the following invention: that is, a manufacturing method of a semiconductor device, and the method includes the steps of:

(a) preparing a semiconductor substrate;

(b) forming an interlayer insulating film having a first main surface and having a predetermined film thickness on the semiconductor substrate;

(c) forming a first wiring groove and a second wiring groove in the first main surface of the interlayer insulating film;

(d) selectively providing a copper film in the first wiring groove and the second wiring groove, thereby forming a first wiring and a second wiring; and (e) subjecting the first wiring, the second wiring, and the first main surface of the interlayer insulating film to plasma treatment containing ammonia, in which a damage layer is formed on the first main surface of the interlayer insulating film and an electric field relaxation layer is formed below the damage layer in the step (e), and nitrogen concentrations of the damage layer and the electric field relaxation layer are higher than a nitrogen concentration of the interlayer insulating film, and the nitrogen concentration of the electric field relaxation layer is higher than the nitrogen concentration of the damage layer.

EXPLANATION OF REFERENCE SIGNS

BARC: antireflection film
BR1, BR2: insulating barrier film
BR11, BR12, BR21, BR22: sub-insulating barrier film
CU1, CU2: copper film
CBR1, CBR2: conductive barrier film
DM1, DM2: damage layer
ER1, ER2: electric field relaxation layer
EST1, EST2: etching stopper film
INS1, INS2, INS3: interlayer insulating film
INS21, INS31, INS32: insulating film
M1W, M2W: wiring
M1V, M2V: plug electrode
NCH, PCH: channel region
NG, PG: gate electrode
NGI, PGI: gate insulating film
NSD, PSD: source region or drain region
NW: N-type well region
PR1, PR2, PR3, PR4: resist film
PW: P-type well region
Qn: N-type MISFET
Qp: P-type MISFET
SUB: P-type semiconductor substrate
SIL: silicide film
ST: element isolation film
VG1, VG2: contact hole
WG1, WG2: wiring groove

What is claimed is:

1. A semiconductor device comprising:
a semiconductor substrate;
an interlayer insulating film formed over the semiconductor substrate;
an electric field relaxation layer formed on the interlayer insulating film;
a damage layer formed on the electric field relaxation layer;
a first wiring and a second wiring which are embedded in the interlayer insulating film, the electric field relaxation layer, and the damage layer;
an insulating barrier film which is in contact with the first wiring, the second wiring, and the damage layer and which covers the first wiring, the second wiring, and the interlayer insulating film, and
wherein the first wiring and the second wiring are adjacent to each other;
wherein the damage layer has a portion positioned between the first wiring and the second wiring,
wherein the electric field relaxation layer is formed between the interlayer insulating film and the damage layer,
wherein the first wiring and the second wiring are mainly made of copper film,
wherein the damage layer and the electric field relaxation layer are layers containing nitrogen, and
wherein a nitrogen concentration of the electric field relaxation layer is higher than a nitrogen concentration of the damage layer.

2. The semiconductor device according to claim 1, wherein the interlayer insulating film is made of an insulating film having a dielectric constant of 3.0 or less.

3. The semiconductor device according to claim 2, wherein the interlayer insulating film includes Si, O, and C.

4. The semiconductor device according to claim 1, wherein the damage layer is present in a depth range of 4 nm from a main surface of the interlayer insulating film.

5. The semiconductor device according to claim 1, wherein the electric field relaxation layer has a peak region of the nitrogen concentration.

6. The semiconductor device according to claim 5, wherein the peak region of the nitrogen concentration is positioned in a range of 5 to 20 nm from a main surface of the interlayer insulating film.

7. The semiconductor device according to claim 1, wherein the electric field relaxation layer is provided at a position shallower than one-half of a thickness of the first wiring based on the main surface of the interlayer insulating film.

8. A semiconductor device comprising:
a semiconductor substrate;
an interlayer insulating film formed on the semiconductor substrate;
a first wiring and a second wiring which are embedded in the interlayer insulating film and are adjacent to each other;
a damage layer positioned between the first wiring and the second wiring; and
an insulating barrier film which is in contact with the first wiring, the second wiring, and the damage layer and which covers the first wiring, the second wiring, and the interlayer insulating film,
wherein the first wiring and the second wiring are mainly made of copper film, and
wherein the insulating barrier film is an insulating film containing nitrogen and has a first surface in contact with the damage layer and a second surface on an opposite side of the first surface, and the insulating barrier film has a first region having a higher nitrogen concentration than a nitrogen concentration of the first surface.

9. The semiconductor device according to claim 8, wherein the first region having the higher nitrogen concentration is positioned on a second surface side.

10. The semiconductor device according to claim 8, wherein a nitrogen concentration of the insulating barrier film increases toward the second surface from the first surface.

11. The semiconductor device according to claim 8, wherein the interlayer insulating film is made of an insulating film having a dielectric constant of 3.0 or less.

12. The semiconductor device according to claim 11, wherein the interlayer insulating film is made of an SiCOH film.

13. The semiconductor device according to claim 8, wherein an electric field relaxation layer is provided in the interlayer insulating film below the damage layer.

14. The semiconductor device according to claim 13, wherein the damage layer and the electric field relaxation layer are layers containing nitrogen, and a nitrogen concentration of the electric field relaxation layer is higher than a nitrogen concentration of the damage layer.

15. A manufacturing method of a semiconductor device, comprising the steps of:
   (a) preparing a semiconductor substrate;
   (b) forming an interlayer insulating film having a first main surface and having a predetermined film thickness over the semiconductor substrate;
   (c) forming a first wiring groove and a second wiring groove in the first main surface of the interlayer insulating film;
   (d) selectively providing a copper film in the first wiring groove and the second wiring groove, thereby forming a first wiring and a second wiring; and
   (e) subjecting the first wiring, the second wiring, and the first main surface of the interlayer insulating film to plasma treatment containing ammonia,
   wherein a damage layer is formed on the first main surface of the interlayer insulating film and an electric field relaxation layer is formed below the damage layer in the step (e), and
   nitrogen concentrations of the damage layer and the electric field relaxation layer are higher than a nitrogen concentration of the interlayer insulating film, and the nitrogen concentration of the electric field relaxation layer is higher than the nitrogen concentration of the damage layer.

16. The manufacturing method of a semiconductor device according to claim 15,
   wherein the interlayer insulating film is made of an SiCOH film, and the SiCOH film is formed by a CVD method using organic silane gas and oxidation gas, and
   the electric field relaxation layer is formed in the SiCOH film by adding ammonia gas during the step of forming the SiCOH film.

17. The manufacturing method of a semiconductor device according to claim 15,
   wherein the interlayer insulating film is made of an SiCOH film, and the SiCOH film is formed by a CVD method using organic silane gas and oxidation gas, and
   the electric field relaxation layer is formed in the SiCOH film by increasing a flow rate of oxygen-based gas during the step of forming the SiCOH film.

18. The manufacturing method of a semiconductor device according to claim 15, further comprising, after the step (e), the step of:
   (f) forming an insulating barrier film having a first surface in contact with the first wiring, the second wiring, and the damage layer and a second surface on an opposite side of the first surface on the interlayer insulating film,
   wherein a nitrogen concentration of the second surface of the insulating barrier film is higher than a nitrogen concentration of the first surface.

\* \* \* \* \*